(12) United States Patent
Yoshioka et al.

(10) Patent No.: US 8,240,036 B2
(45) Date of Patent: Aug. 14, 2012

(54) METHOD OF PRODUCING A CIRCUIT BOARD

(75) Inventors: Shingo Yoshioka, Osaka (JP); Hiroaki Fujiwara, Ikoma (JP)

(73) Assignee: Panasonic Corporation, Osaka (JP)

( * ) Notice: Subject to any disclaimer, the term of this patent is extended or adjusted under 35 U.S.C. 154(b) by 924 days.

(21) Appl. No.: 12/326,169

(22) Filed: Dec. 2, 2008

(65) Prior Publication Data

US 2009/0272562 A1 Nov. 5, 2009

(30) Foreign Application Priority Data

| | | |
|---|---|---|
| Apr. 30, 2008 | (JP) | 2008-118818 |
| Jul. 28, 2008 | (JP) | 2008-193931 |
| Aug. 26, 2008 | (JP) | 2008-217091 |
| Sep. 25, 2008 | (JP) | 2008-246431 |

(51) Int. Cl.
*H05K 3/02* (2006.01)

(52) U.S. Cl. ........... 29/846; 29/830; 29/831; 29/832; 29/852; 29/623.4

(58) Field of Classification Search ............ 29/846, 29/847, 830, 831, 832, 852, 841, 881, 623.1; 174/255, 259, 260, 251, 110 SR; 427/195, 427/221, 222, 302, 307, 340; 439/67, 77, 439/492, 684, 99, 371

See application file for complete search history.

(56) References Cited

U.S. PATENT DOCUMENTS

| | | | | |
|---|---|---|---|---|
| 5,041,356 A | * | 8/1991 | Takeda et al. | 430/270.1 |
| 5,372,769 A | * | 12/1994 | Ryberg | 264/254 |

(Continued)

FOREIGN PATENT DOCUMENTS

DE 19645854 5/1998

(Continued)

OTHER PUBLICATIONS

U.S. Appl. No. 12/431,950 to Shingo Yoshioka et al, filed Apr. 29, 2009 and entitled "Method of Producing Circuit Board by Additive Method, and Circuit Board and Multilayer Circuit Board Obtained by the Method."

(Continued)

*Primary Examiner* — Derris Banks
*Assistant Examiner* — Tai Nguyen
(74) *Attorney, Agent, or Firm* — Greenblum & Bernstein, P.L.C.

(57) ABSTRACT

An object of an aspect of the present invention is to provide a method of producing a circuit board that allows highly accurate preservation of the circuit profile and gives a circuit having a desired depth in preparation of a fine circuit by additive process.

The method of producing a multilayer circuit board in an aspect of the present invention includes a film-forming step of forming a swellable resin film on the surface of an insulative substrate, a circuit groove-forming step of forming circuit grooves having a depth equal to or greater than the thickness of the swellable resin film on the external surface of the swellable resin film, a catalyst-depositing step of depositing a plating catalyst or the precursor thereof on the surface of the circuit grooves and the surface of the swellable resin film, a film-separating step of swelling the swellable resin film with a particular liquid and then separating the swollen resin film from the insulative substrate surface, and a plating processing step of forming an electrolessly plated film only in the region where the plating catalyst or the plating catalyst formed from the plating catalyst precursor remains unseparated after separation of the swellable resin film.

16 Claims, 24 Drawing Sheets

U.S. PATENT DOCUMENTS

| | | | |
|---|---|---|---|
| 5,792,595 A * | 8/1998 | Takayanagi et al. | 430/325 |
| 6,004,619 A | 12/1999 | Dippon et al. | |
| 6,184,479 B1 | 2/2001 | Okabe et al. | |
| 6,413,687 B1 * | 7/2002 | Hattori et al. | 430/10 |
| 6,426,127 B1 * | 7/2002 | Ross et al. | 427/503 |
| 6,606,792 B1 * | 8/2003 | Andresakis | 29/846 |
| 6,640,434 B1 | 11/2003 | Wojewnik et al. | |
| 6,803,400 B1 * | 10/2004 | Butterbach et al. | 524/270 |
| 2002/0117400 A1 | 8/2002 | Hotta | |
| 2004/0197487 A1 | 10/2004 | Aoki et al. | |
| 2005/0163919 A1 | 7/2005 | Murata | |
| 2006/0165877 A1 | 7/2006 | Yanagimoto et al. | |
| 2008/0008824 A1 | 1/2008 | Cho et al. | |
| 2011/0247860 A1 | 10/2011 | Yoshioka et al. | |

FOREIGN PATENT DOCUMENTS

| | | |
|---|---|---|
| EP | 0260514 | 3/1988 |
| EP | 0817549 | 1/1998 |
| JP | 57-134996 | 8/1982 |
| JP | 58-186994 | 11/1983 |
| JP | 63-183445 | 7/1988 |
| JP | 2-68988 | 3/1990 |
| JP | 7-509322 | 10/1995 |
| JP | 10-078654 | 3/1998 |
| JP | 10-233562 | 9/1998 |
| JP | 11-212262 | 8/1999 |
| JP | 2000-231190 | 8/2000 |
| JP | 2000-236149 | 8/2000 |
| JP | 2001-201851 | 7/2001 |
| JP | 2001-251042 | 9/2001 |
| JP | 2002-252445 | 9/2002 |
| JP | 2002-361475 | 12/2002 |
| JP | 2003-046243 | 2/2003 |
| JP | 2003-264359 | 9/2003 |
| JP | 2003-273484 | 9/2003 |
| JP | 2003-309346 | 10/2003 |
| JP | 2004-48030 | 2/2004 |
| JP | 2004-281427 | 10/2004 |
| JP | 2007-88288 | 4/2007 |
| JP | 2008-22002 | 1/2008 |
| JP | 2008-058710 | 3/2008 |
| WO | 94/01985 | 1/1994 |
| WO | 2005/104638 | 3/2005 |

OTHER PUBLICATIONS

Korea Office action (with partial English-language translation) that issued with respect to patent family member Korean Patent Application No. 10-2010-7021143, mail date is Oct. 14, 2011.

Korea Office action that issued with respect to patent family member Korean Patent Application No. 11-2011-7029869, mail date is Jan. 10, 2012.

Korea Office action that issued with respect to patent family member Korean Patent Application No. 11-2011-7029871, mail date is Jan. 10, 2012.

Korea Office action that issued with respect to patent family member Korean Patent Application No. 11-2011-7029872, mail date is Jan. 10, 2012.

U.S. Appl. No. 12/431,950 to Shingo Yoshioka et al, filed Apr. 29, 2009 and entitled "Method of Producing Circuit Board by Additive Method, and Circuit Board and Multilayer Circuit Board Obtained by the Method.".

International Search Report that issued with respect to PCT/JP2009/058794, mailed Apr. 12, 2009.

Japan Office Action that issued with respect to patent family member Japanese Patent Application No. 2009-104086, mail date is May 22, 2012.

International Search Report that issued with respect to patent family member International Patent Application No. PCT/JP2009/070106, mail date is Jan. 26, 2010.

International Search Report that issued with respect to patent family member International Patent Application No. PCT/JP2010/006378, mail date is Jan. 11, 2011.

Partial European Search Report that issued with respect to patent family member European Patent Application No. 12001246.3, mail date is May 15, 2012.

European Search Report that issued with respect to patent family member European Patent Application No. 09830368.8, mail date is May 24, 2012.

Korean Office Action issued with respect to related Korean Application No. 2010-7021143, dated Jun. 11, 2012 with translation.

\* cited by examiner

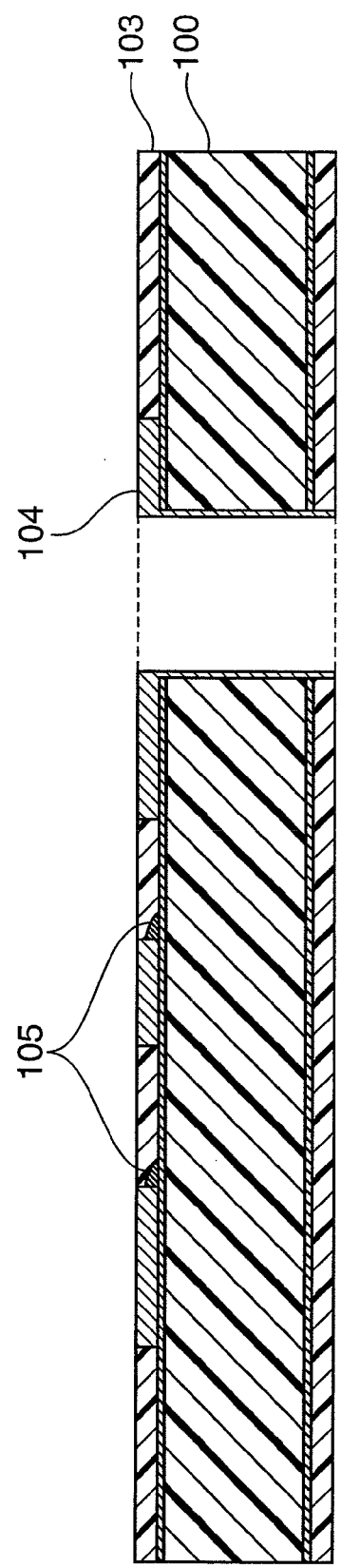

METHOD OF PRODUCING A CIRCUIT BOARD

TECHNICAL FIELD

The present invention relates to a method of producing a circuit board by additive method and a circuit board and a multilayer circuit board obtained by the method.

BACKGROUND ART

Recently, there is a rapid increase in functionality of electrical apparatuses including portable information systems such as cellphone; computer and its peripheral devices; various home information appliances, and others. Along with the trend, there is also an increasing demand for improvement in density of the circuit on the circuit board used in these electrical apparatuses. For improvement in density of such a circuit, needed is a method of producing circuits having narrower line width and line interval accurately. There are problems, such as short circuiting and migration between wires, frequently found in high-density wiring circuit. In addition, narrow-width wiring leads to deterioration in mechanical strength of wiring, making the resulting circuits more vulnerable to circuit breakage, for example, by impact.

Subtractive and additive methods have been known as the methods of forming such a circuit on circuit board. The subtractive method is a method of forming a circuit by removing (subtracting) the metal in the area on the surface of a metal clad laminate, excluding that where the circuit is desirably formed. On the other hand, the additive method is a method of forming a circuit only in the region on the insulative substrate where a circuit is desirably formed by electroless plating.

The subtractive method is a method of leaving a metal only in the circuit-forming region, by etching of the thick-film metal foil. The metal in the region removed is only wasted by the method. In contrast, the additive method, by which the electrolessly plated film is formed only in the region where the metal wires are desirably formed, does not result in waste of the metal. From the point above, the additive method is more preferable as the circuit-forming method.

Full-additive method, one of typical conventional additive methods, will be described with reference to the schematic crosssectional views of FIGS. 1A to 1E.

As shown in FIG. 1A, a plating catalyst 102 is deposited on the surface of an insulative substrate 100 having throughholes 101. The surface of the insulative substrate 100 is previously roughened. As shown in FIG. 1B, a photoresist layer 103 is then formed thereon. Then as shown in FIG. 1C, the surface of the photoresist layer 103 is exposed to light via a photomask 110 having a particular patterned circuit. As shown in FIG. 1D, the circuit pattern is then developed. As shown in FIG. 1E, metal wires 104 are formed after electroless copper plating on the circuit pattern formed by development and on the internal wall surface of the throughholes 101. A circuit is formed on an insulative substrate 100 by these steps.

In the conventional additive method described above, a plating catalyst 102 is deposited on the entire surface of the insulative substrate 100. As a result, it caused the following problem. If the photoresist layer 103 is developed at high accuracy, a plated film can be formed only in the region unprotected with the photoresist. However, if the photoresist layer 103 is not developed at high accuracy, an undesirably plated region 105 may remain unremoved in the region where the plating is undesirable, as shown in FIG. 2. Such a trouble occurs, because the plating catalyst 102 is deposited on the entire surface of the insulative substrate 100. The undesirably plated region 105 causes short circuiting and migration between neighboring circuits. The short circuiting and the migration are found more frequently, when a circuit having narrower line width and line interval is formed.

JP-A No. 58-186994 (Patent Document 1) discloses the following method:

A protective film is first coated on an insulative substrate (first step). Then, grooves and throughholes corresponding to a wiring pattern are formed on the insulative substrate coated by the protective film by mechanical processing or irradiation of laser beam (second step). An activation layer is then formed on the entire surface of the insulative substrate (third step). The activation layer is then left only on the internal wall surface of the grooves and throughholes, by separating the protective film and thus removing the activation layer on the insulative substrate (fourth step). Then, an electrically conductive layer is formed selectively only on the internal wall surface of the activated grooves and throughholes by plating on the insulative substrate without use of a plating protective film (fifth step). The method will be described with reference to schematic crosssectional views of FIGS. 3A to 3E explaining the steps of forming a metal wiring pattern.

As shown in FIG. 3A, a protective film 201 is coated on the surface of an insulative substrate 200. Then as shown in FIG. 3B, grooves 202 and throughholes 203 in a desired wiring pattern are formed on the insulative substrate 200 coated by the protective film 201. As shown in FIG. 3C, a plating catalyst 204 is then deposited on the surface of the grooves 202 and throughholes 203 and also on the surface of the protective film 201. As shown in FIG. 3D, the plating catalyst 204 is left only on the surface of the groove 202 and throughhole 203 after separation of the protective film 201. As shown in FIG. 3E, an electrolessly plated film is formed selectively only in the region having the residual plating catalyst 204, giving an electrically conductive layer 205 only on the internal wall surface of the throughholes 203 and grooves 202.

Patent Document 1 describes a method of coating and heat-curing a thermosetting resin on an insulative substrate as a protective film, machine-processing the protective film and the insulative substrate according to a particular wiring pattern, and removing the thermosetting resin on the insulative substrate surface with a solvent (Patent Document 1, p. 2, left bottom column, 1.16 to right bottom column, 1.11).

The kind of the thermosetting resin used as the protective film in Patent Document 1 is not described specifically. Common thermosetting resins are higher in solvent resistance and thus, had a problem that the resins are hardly removed simply with a solvent. Such a thermosetting resin is often excessively adhesive to the resinous substrate, making it difficult to separate only the protective film reliably without leaving fragments of the protective film on the resinous substrate surface. If a strong solvent is used for sufficient separation or the substrate is immersed in a solvent for a prolonged period of time, the plated catalyst on the substrate surface is removed together. In this case, no electrically conductive layer is formed in the region where the plating catalyst is removed. In addition, use of a strong solvent or immersion for a prolonged period of time occasionally resulted in fragmentation of the protective film of thermosetting resin and redispersion of the plating catalyst of protective film into the solvent. The plating catalyst redispersed in solvent is redeposited on the resin substrate surface, possibly forming an undesirably plated film in the region. For that reason, it was difficult to form a circuit having an accurate pattern by the method disclosed in Patent Document 1.

Alternatively, JP-A No. 57-134996 (Patent Document 2) discloses the following method as another additive method: A first photosensitive resin layer soluble in organic solvent and a second photosensitive resin layer soluble in alkali solution are first formed on an insulative substrate. The first and second photosensitive resin layers are exposed to light via a photomask in a particular circuit pattern. The first and second photosensitive resin layers are then developed. A catalyst was then deposited by adsorption on the entire surface having dents formed after development, and only the undesired catalyst is removed, while the alkali-soluble second photosensitive resin is dissolved with an alkaline solution. A circuit is then formed accurately only in the region having the plating catalyst. However, such a method demands preparation of two kinds of photosensitive resin layer different in solvent solubility, development thereof with two kinds of solvents, and solubilization of the second photosensitive resin with an alkaline solution after adsorption of catalyst, and thus, the production process was very complicated.

Preparation of an electrical circuit having narrow line width and line interval by using the circuit-forming method described above also caused the following problem: Specifically, decrease in line width and line interval of the circuit leads to deterioration in wire strength. The deterioration in wire strength in turn leads to deterioration in reliability of the resulting electronic devices.

Specifically, a problem that may occur in the circuit board, when used in portable information systems such as cellphones, will be described below as an example. Relatively large LSI (Large Scale Integration) circuit boards are used in portable information systems. Such LSIs are connected to the land regions formed on circuit board by solder bumping. Portable information systems are often exposed to impacts, while they are carried. Exposure to such an impact makes a physical force applied to the LSI mounted, possibly damaging the metal wires constituting the land regions by breakage. Similarly, the LSIs may also be damaged by separation of the contact points between the LSIs and the substrate. Decrease in line width and line interval of the electrical circuit leads to increase in frequency of circuit damage.

To solve the problems above, the metal wires may be reinforced by increase of the line width of the circuit wire. However, such a method prohibits increase in circuit density. The thickness of the metal wires in the circuit obtained by the subtractive method depends on the thickness of the copper foil used, and thus, it is also not possible to reinforce the metal wires by thickening the film.

Recently, a build-up method of forming each layer of circuit one by one and laminating the layers while forming interlayer-connecting vias therein is known as the method of producing a high-density multilayer circuit board. The general steps of the build-up method will be described with reference to the schematic crosssectional vies of FIGS. 4A to 4G.

In the build-up method, as shown in FIG. 4A, metal wires 301 are first formed on a first-layer insulative substrate 300. Then as shown in FIG. 4B, an insulation resin layer 302 is formed on the surface of the insulative substrate 300. The insulation resin layer 302 is formed, for example, by coating and hardening a liquid resin or bonding an insulator film thereto. Then as shown in FIG. 4C, viaholes (IVH) 304 are formed in the insulation resin layer 302. IVHs 304 are formed by laser processing. As shown in FIG. 4D, a resinous residue smear (resin smear) 305 remains on the bottom of each IVH 304 formed by laser processing. The metal wire 301 is a thin film. Accordingly, the metal wire 301 may be thinned or may have a hole, if the resin smear 305 is treated for complete removal by laser processing. For that reason, the laser irradiation should be terminated before complete removal of the insulation resin.

The resin smear 305 remaining on the bottom of IVH 304 may possibly cause conductivity troubles. Thus as shown in FIG. 4D, the resin smear 305 should be removed. The resin smear 305 is removed by desmear treatment. The desmear treatment is a treatment of removing the resin smear by solubilization, specifically by dissolving the resin smear, for example, in permanganic acid solution. Then as shown in FIG. 4E, a photoresist layer 306 is formed on the surface of the insulation resin layer 302. As shown in FIG. 4F, the surface of the photoresist layer 306 is then exposed to light via a particular circuit-patterned photomask not shown in the Figure, and the resulting circuit pattern is developed. As shown in FIG. 4G, metal wires 307 are formed by electroless copper plating on the developed circuit patterned regions and throughholes.

SUMMARY OF THE INVENTION

An object of an aspect of the present invention is to provide a method of producing a circuit board that allows highly accurate preservation of the circuit profile and gives a circuit having a desired depth in preparation of a fine circuit by additive method.

The method of producing a circuit board in an aspect of the present invention includes a film-forming step of forming a swellable resin film on the surface of an insulative substrate, a circuit groove-forming step of forming circuit grooves having a depth equal to or greater than the thickness of the swellable resin film on the external surface of the swellable resin film, a catalyst-depositing step of depositing a plating catalyst or the precursor thereof on the surface of the circuit grooves and the surface of the swellable resin film, a film-separating step of swelling the swellable resin film with a particular liquid and then separating the swollen resin film from the insulative substrate surface, and a plating processing step of forming an electrolessly plated film only in the region where the plating catalyst or the plating catalyst formed from the plating catalyst precursor remains unremoved after separation of the swellable resin film.

BRIEF DESCRIPTION OF THE DRAWINGS

FIG. 2 is a drawing explaining the profile of the circuit formed by a conventional full-additive method.

FIG. 17A is a schematic crosssectional view illustrating a conductive bump with its head unexposed and embedded in the insulation layer, while

FIRST EMBODIMENT

Preparation of Circuit Board by Using Swellable Resin Film

The method of producing a circuit board in the present embodiment will be described with reference to diagrams. FIGS. 5A to 5E are schematic crosssectional views explaining the steps in the method of producing a circuit board in the first embodiment. In FIGS. 5A to 5E, 1 represents an insulative substrate; 2 represents a swellable resin film; 3 represents a circuit groove; 4 represents a through-hole penetrating through part of the circuit groove 3; 5 represents a plating catalyst; and 6 represents an electrolessly plated film.

Figure 1A:
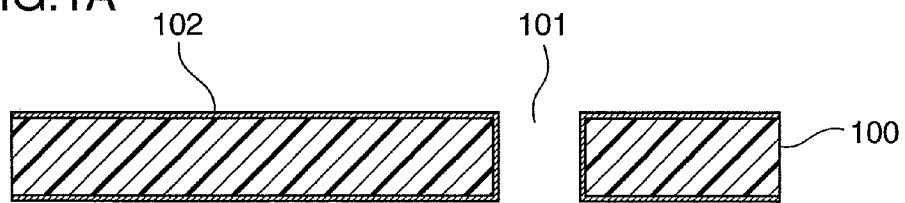
FIGS. 1A to 1E are schematic crosssectional views respectively explaining the steps of forming metal wiring by a conventional full-additive method.
Figure 1B:
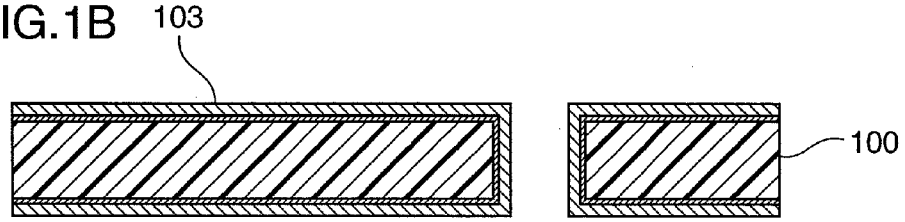
Figure 1C:
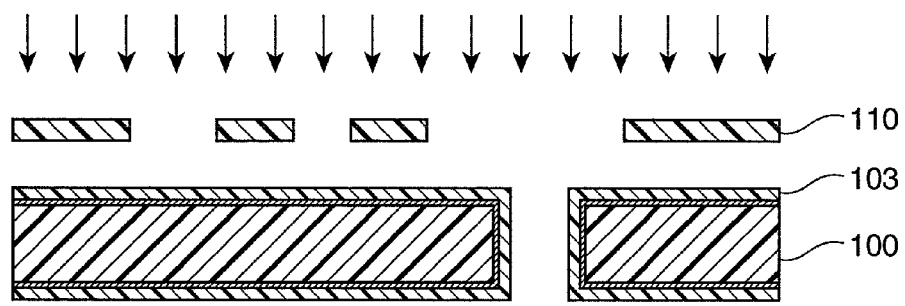
Figure 1D:
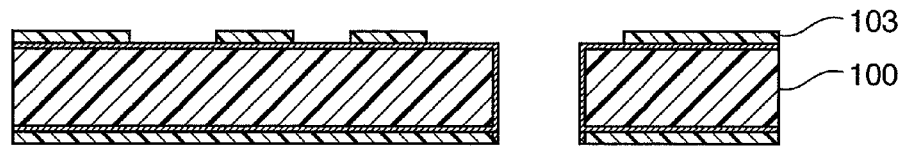
Figure 1E:
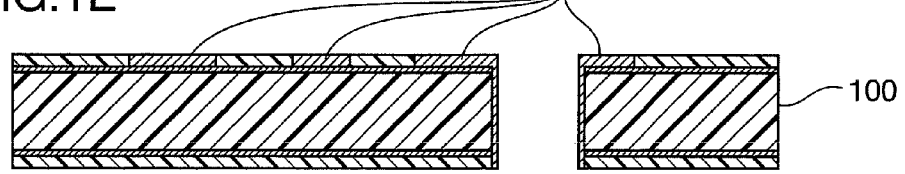
Figure 3A:
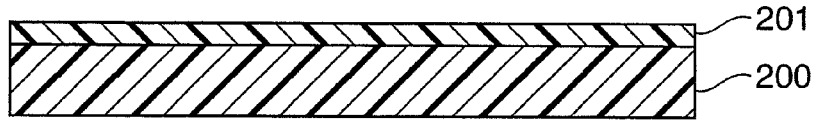
FIGS. 3A to 3E are schematic crosssectional views respectively explaining the steps of forming metal wiring by the additive method described in Patent Document 1.
Figure 3B:
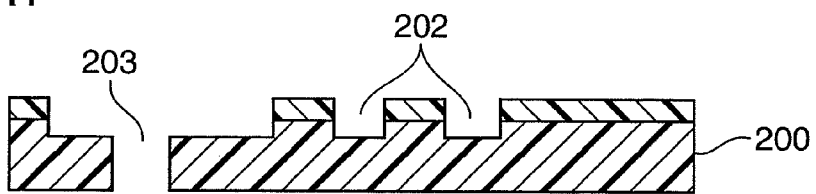
Figure 3C:
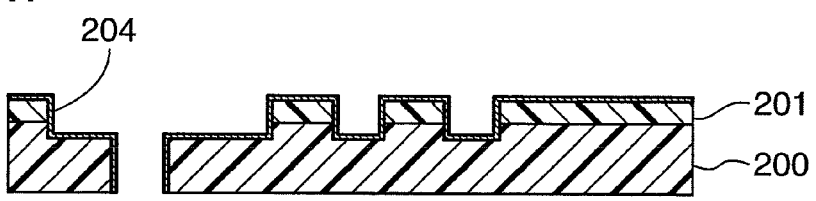
Figure 3D:
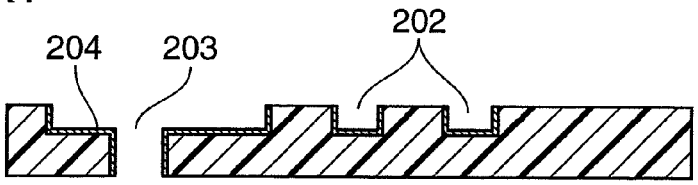
Figure 3E:
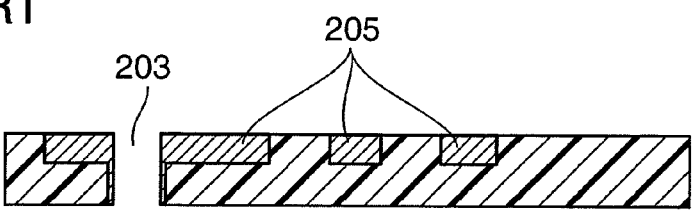
Figure 4A:
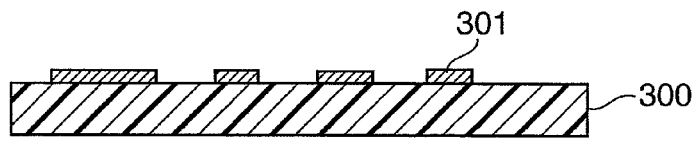
FIGS. 4A to 4G are schematic crosssectional views respectively explaining the steps of forming metal wiring by a conventional build-up method.
Figure 4B:
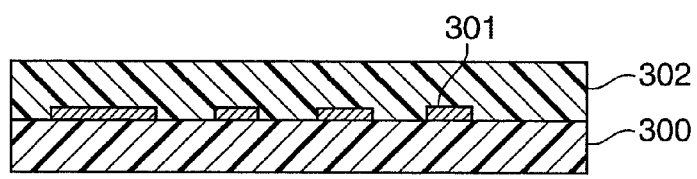
Figure 4C:
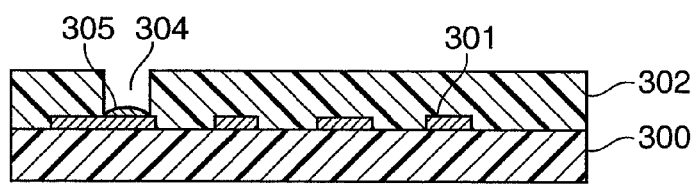
Figure 4D:
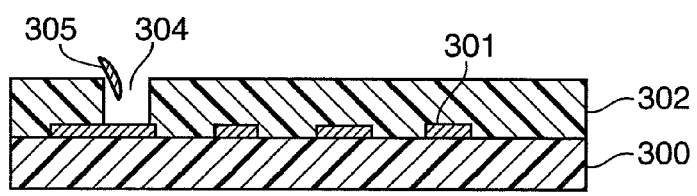
Figure 4E:
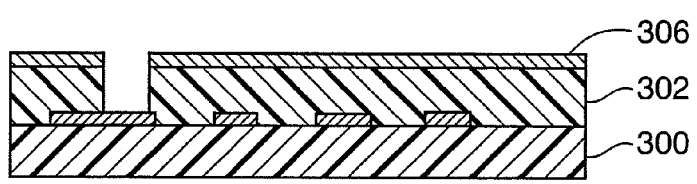
Figure 4F:
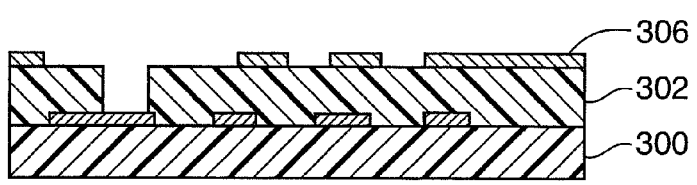
Figure 4G:
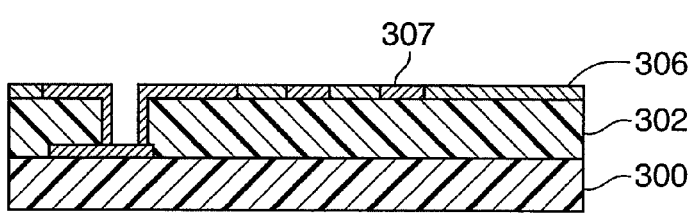
Figure 5A:
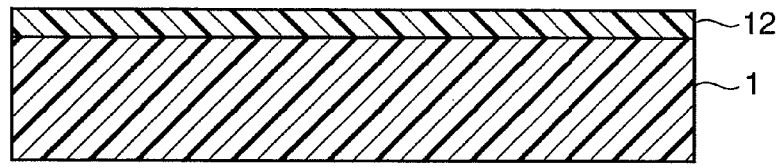
FIGS. 5A to 5E are schematic crosssectional views respectively explaining the steps of forming metal wiring by the method of producing an electrical circuit in the first embodiment.

In the production method of the present embodiment, as shown in FIG. 5A, a swellable resin film 2 is first formed on the surface of an insulative substrate 1. The swellable resin film means a resin film easily separated from the substrate surface by swelling with a particular liquid.

Various organic substrates used in production of circuit boards can be used as the insulative substrate 1 without particular restriction. Typical examples of the organic substrates include those such as of epoxy resin, acrylic resin, polycarbonate resin, polyimide resin, and polyphenylene sulfide resin. The substrate shape is not particularly limited, and the substrate may be sheet, film, prepreg, three-dimensional molding, or the like. The thickness of the insulative substrate 1 is not particularly limited. In the case of a sheet, film or prepreg, the thickness is preferably, for example, 10 to 200 µm, more preferably about 20 to 100 µm.

The method of forming the swellable resin film 2 is not particularly limited. Specifically, such a film is formed, for example, by a method of coating and drying a liquid material capable of forming a swellable resin film 2 on the main surface of the insulative substrate 1. Alternatively, a method of bonding a resin film of swellable resin film 2 on the main surface of the insulative substrate 1 may be used.

The material for the swellable resin film 2 is not particularly limited, if it is a resin mostly insoluble in the swelling solution described below and easily separated from the insulative substrate 1 surface when swollen. A resin having a swelling degree of 50% or more, more preferably 100% or more, and 1000% or less in a particular liquid is used favorably. A resin having an excessively low swelling degree often makes the swellable resin film less easily separated. Alternatively, a resin having an excessively high swelling degree often gives a film with lower film strength, making it difficult to separate the film due to breakage.

Such a swellable resin film can be formed easily, for example, by a method of applying and drying an elastomer suspension or emulsion on the surface of an insulative substrate or by transferring a film previously formed by coating and drying an elastomer suspension or emulsion on a support substrate onto the surface of the insulative substrate surface.

Typical examples of the elastomers include, diene-based elastomers such as styrene-butadiene-based copolymers, acrylic elastomers such as acrylic ester-based copolymers, polyester elastomers and the like. With such an elastomer, it is possible to form a swellable film having a desired swelling degree easily by adjusting for example of the crosslinking degree or the gelation degree of the elastomer resin particles dispersed in the suspension or emulsion.

The coating method is not particularly limited. Specifically, a method traditionally known such as spin coating or bar coater coating can be used without any restriction.

The thickness of the swellable resin film 2 is preferably 10 μm or less, more preferably 5 μm or less and 0.1 μm or more, more preferably 1 μm or more. An excessively large thickness may lead to deterioration in accuracy during fine circuit patterning by laser processing. Alternatively, an excessively low thickness may make it difficult to produce a uniform thickness film.

Figure 5B:
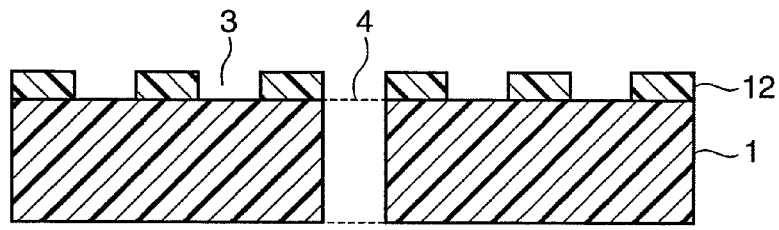
Figure 5E:
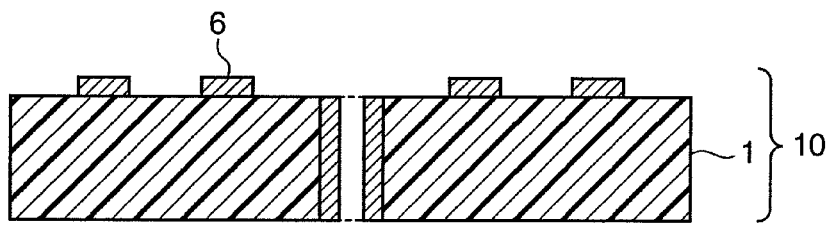
Figure 6:
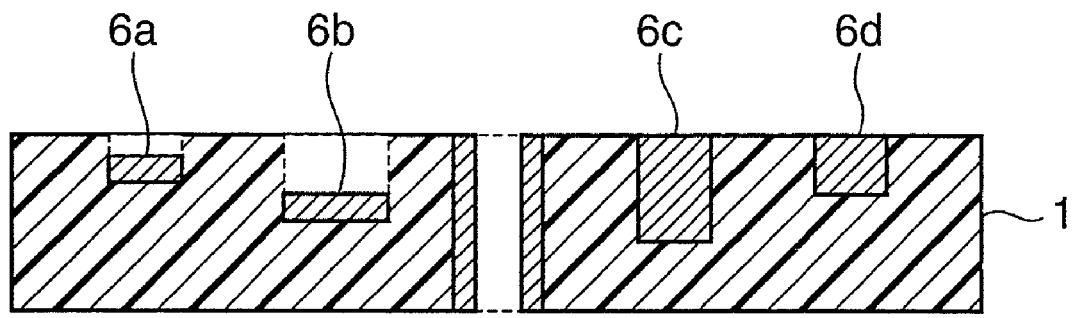
FIG. 6 is a schematic crosssectional view illustrating the shape of the electrical circuit formed by using circuit grooves prepared by machining an insulative substrate to various depths.

Then as shown in FIG. 5B, circuit grooves 3 having a depth equal to or larger than the thickness of the swellable resin film 2 are formed in a predetermined pattern on the external surface of the swellable resin film 2 formed. The circuit grooves 3 are formed, for example, by laser processing, machining or embossing. In addition, through-holes 4 for preparation of viaholes may be formed in part of the circuit grooves 3. In the step, the pattern and the depth of circuit and the diameter and the position of the viaholes are specified. In this case, if circuit grooves have a depth equal to the thickness of the swellable resin film 2 are formed, a circuit is formed on the surface of the insulative substrate without any engraving of the insulative substrate, as shown in FIG. 5E. Alternatively, if the circuit grooves are engraved to a depth larger than the thickness of the swellable resin film 2, the insulative substrate itself is engraved, giving a circuit engraved into the insulative substrate 1, as shown in FIG. 6.

The width of the circuit formed is not particularly limited. When laser processing is used, fine circuits having a line width of 20 μm or less can be formed easily.

In addition in the present step, through-holes 4 may be formed for electrical communication between layered circuits. The through-holes 4 can be used as viaholes or inner viaholes in production of a multilayer circuit board having multiple circuit layers. The internal wall surface of the through-holes 4 is electrolessly-plated for interlayer electrical communication in a later step.

The method of forming the circuit grooves is not particularly limited. Specifically, it is formed, for example, by laser processing, machining such as dicing, embossing, or the like. Laser processing is favorable for production of high-accuracy fine circuits. It is possible to adjust the depth and others arbitrarily by modifying the laser power by laser processing. For example, embossing processing by using a fine mold, such as that used in the field of nanoimprint, is carried out favorably.

The circuit grooves 3 formed in a particular circuit pattern defines the region of electrical circuit formed after electrolessly plated film is provided.

Figure 5C:
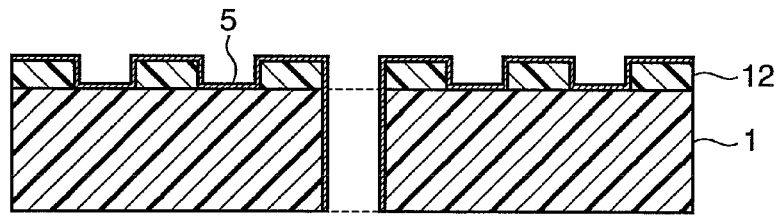

Then as shown in FIG. 5C, a plating catalyst 5 is deposited on the entire surface, including the surface having the circuit grooves 3 formed and the surface having no circuit groove formed (catalyst-depositing step). Then, if there are through-holes 4 formed, the plating catalyst 5 is also deposited on the internal wall surface of the through-holes 4.

The plating catalyst 5 is a catalyst to form a plated film only in the region where an electrolessly plated film is desirably formed in the plating processing step described below. The plating catalyst for use is not particularly limited, if it is a catalyst of electroless plating. Alternatively, a precursor of the plating catalyst may be first deposited and then the plating catalyst formed after separation of the swellable resin film.

Typical examples of the plating catalysts include, for example, palladium (Pd), platinum (Pt), silver (Ag), the precursors thereof, and the like.

Examples of the methods of depositing the plating catalyst 5 include the following method: First, an insulative substrate 1 having the circuit grooves 3 formed thereon is washed as immersed in a hot surfactant solution for removal of oils and other stains on the surface. It is then immersed, for example, in an aqueous stannous chloride solution at a concentration of approximately 0.1% for adsorption of stannous chloride and additionally, for example, in an aqueous palladium chloride solution at a concentration of approximately 0.01% for adsorption of palladium chloride. The stannous chloride and palladium chloride adsorbed react with each other in the following oxidation-reduction reaction:

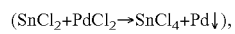

$(SnCl_2 + PdCl_2 \rightarrow SnCl_4 + Pd\downarrow)$, leaving metal palladium precipitated as the plating catalyst.

By the catalyst-depositing treatment, as shown in FIG. 5C, the plating catalyst 5 is deposited on the surface of circuit groove 3, the internal wall surface of the through-holes 4, and the surface of the swellable resin film 2.

Figure 5D:
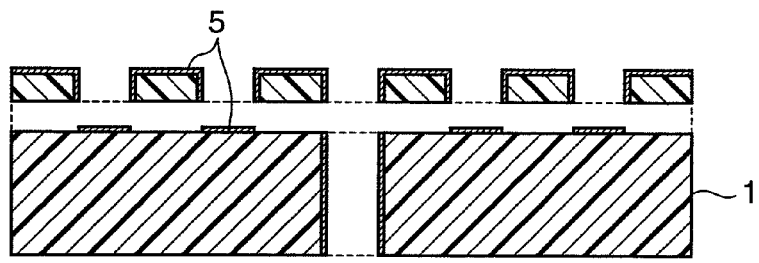

Then as shown in FIG. 5D, the swellable resin film 2 is removed from the surface of the insulative substrate 1, as it is swollen with a particular liquid (film-separating step). In the step, the plating catalyst 5 remains deposited on the surface of the insulative substrate 1 where the circuit grooves 3 and the through-holes 4 are formed. On the other hand, the plating catalyst 5 coated on the surface of the swellable resin film 2 is removed, as it is held on the swollen resin film 2.

The liquid swelling the swellable resin film 2 for use is not particularly limited, if it is a liquid swelling the swellable resin film 2 to the degree allowing easily separation without mostly decomposing or dissolving the insulative substrate 1 and the plating catalyst 5. Such a swelling solution is selected properly according to the kind of the swellable resin film 2. Specifically, for example, an aqueous alkaline solution such as an aqueous sodium hydroxide solution at a concentration of about 1 to 10% is used favorably, when the swellable resin film is made of an elastomer such as diene-based elastomer, acrylic elastomer, or polyester elastomer.

The swellable resin film 2 is swollen, for example, by a method of immersing the insulative substrate 1 coated with a swellable resin film 2 in a swelling solution for a particular period of time. The substrate is preferably ultrasonicated during immersion, for improvement in separation efficiency. If the film is not separable only by swelling, it may be peeled off as needed with small force.

Then as shown in FIG. 5E, an electrolessly plated film 6 is formed only in the region where the plating catalyst 5 remains deposited (plating processing step). In the step, the electrolessly plated film is deposited in the region having the circuit grooves 3 and through-holes 4 formed.

The electroless plating treatment is carried out, for example, by a method of immersing the insulative substrate 1 locally carrying a plating catalyst 5 in an electroless plating solution and thus depositing an electrolessly plated film only in the region having the plating catalyst 5 coated.

Examples of the metals for use in the electroless plating include copper (Cu), nickel (Ni), cobalt (Co), aluminum (Al) and the like. In particular, plating with metals containing Cu as the principal component is preferable from the point of conductivity. Use of a plating solution containing Ni is also favorable for production of the film superior in corrosion resistance and adhesiveness to solder.

The thickness of the electrolessly plated film 6 is not particularly limited. Specifically, it is preferably, for example, 0.1 to 10 μm, more preferably about 1 to 5 μm.

In the plating processing step, an electrolessly plated film is deposited only in the region of the insulative substrate 1 surface where there is the plating catalyst 5 remaining. It is thus possible to form an electrically conductive layer accurately only in the region where the circuit grooves are formed. On the other hand, it is possible to prevent deposition of the electrolessly plated film in the region where there is no circuit groove formed. Therefore, there is no undesirable plated film remaining in the region between neighboring circuits, even when multiple fine circuits having a small line width are formed at a narrow pitch interval. It is thus possible to prevent generation of short circuiting and migration.

The circuit board 10 shown in FIG. 5E is formed by the procedure above. In the production method described in the present embodiment, it is possible to control the film thickness and the depth of the circuit arbitrarily by adjusting the depth of the circuit groove. As shown in FIG. 6, it is thus possible to form, for example, a circuit 6a in the region deep in the insulative substrate 1 and multiple circuits at positions mutually different from each other (e.g., 6a and 6b in FIG. 6). Also as shown by 6c and 6d in FIG. 6, it is also possible to form thick circuits by forming deep circuit grooves. The thick circuit has greater sectional area and thus, larger strength and electric capacity.

Hereinafter, the production method in the present embodiment will be described more specifically with reference to an Example. It should be understood that the scope of the present invention is not restricted at all by the following Example.

Example 1

A styrene-butadiene copolymer (SBR) film of 2 μm in thickness was formed on the surface of an epoxy resin substrate having a thickness of 100 μm (R1766, manufactured by Panasonic Electric Works Co., Ltd.). The film was formed by coating a styrene-butadiene copolymer (SBR) suspension in methylethylketone (MEK) (manufactured by Zeon Corporation, particle diameter: 200 nm, solid matter: 15%) on the main face of the epoxy resin substrate and drying the resulting coating film at 80° C. for 30 minutes.

Grooves having an almost rectangular cross section having a width of 20 μm and a depth of 30 μm were formed on the epoxy resin substrate carrying the formed film by laser processing. MODEL 5330 manufactured by ESI equipped with a UV-YAG laser was used in the laser processing.

The laser-processed epoxy resin substrate was then immersed in a cleaner conditioner (surfactant solution C/N3320, manufactured by Rohm and Haas Electronic Materials K.K.) and then washed with water. It was further pre-dipped in PD404 (manufactured by Rohm and Haas Electronic Materials K.K.). It was further immersed in a catalyst solution (CAT44, manufactured by Rohm and Haas Electronic Materials K.K.), for deposition of palladium, the nuclei in electroless copper plating, in the state of tin-palladium colloid on the epoxy resin substrate.

It is then immersed in Accelator Solution (ACC19E, manufactured by Rohm and Haas Electronic Materials K.K.) for generation of palladium nuclei. Next, the epoxy resin substrate was immersed in 5% aqueous sodium hydroxide solution under ultrasonication for 10 minutes. As a result, the SBR film on surface was swollen and separated. There was then no fragment of the SBR film remaining on the surface of the epoxy resin substrate. Then, the epoxy resin substrate was immersed in an electroless plating solution (CP-251, Rohm and Haas Electronic Materials K.K.) for electroless copper plating.

The electroless copper plating resulted in deposition of an electroless copper plated film having a thickness of from 3 to 5 μm. Observation of the surface of the epoxy resin substrate after electroless copper plating under SEM (scanning electron microscope) showed that an electrolessly plated film was formed accurately only in the region of the laser-processed region.

The swelling degree of the swellable resin film was determined in the following manner:

A SBR suspension for preparation of swellable resin film was coated on release paper and dried at 80° C. for 30 minutes, to give a resin film having a thickness of 2 μm. A sample was obtained by removing the formed film forcefully.

About 0.02 g of the sample obtained was weighed accurately. The sample weight then was designated as the weight before swelling m(b). The weighed sample was immersed in 10 ml of 5% aqueous sodium hydroxide solution at 20±2° C. for 15 minutes. The mixture was centrifuged in a centrifuge at 1000 G for 10 minutes, for removal of water absorbed on the sample. The weight of the swollen sample after centrifugation was designated as the weight after swelling m(a). The swelling degree was calculated from the weight before swelling m(b) and the weight after swelling m(a) thus obtained, according to the following Formula: "Swelling degree SW= $(m(a)-m(b))/m(b) \times 100(\%)$". Other conditions were the same as those described in JIS L1015 8.27 (method for measuring alkali swelling degree). The swelling degree obtained then was 750%.

As described above, it is possible by using the production method in the present embodiment to deposit a plating catalyst only in the region of the substrate surface where the circuit is desirably formed, by removing the swellable resin film. Thus, an electrolessly plated film is formed accurately only in the region where the plating catalyst is deposited. In addition, because the swellable resin film can be removed easily under the swelling action, the separation step is also carried out easily and accurately.

SECOND EMBODIMENT

Method of Forming a Partial Reinforcing Structure in Fine Wiring

It is possible to form a partial reinforcing structure for partial reinforcement of the circuit as will be described below by applying the method of producing a circuit board described in the first embodiment.

The method of producing a circuit board in the present embodiment will be described specifically with reference to drawings. Items common to those in the description of the first embodiment are described only briefly for prevention of duplication.

FIGS. 7A to 7E are schematic crosssectional views respectively explaining the steps in the method of producing a circuit board in the second embodiment.

Figure 7A:
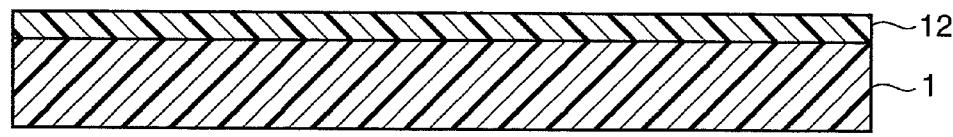
FIGS. 7A to 7E are schematic crosssectional views respectively explaining the steps in the method of producing a circuit board in the second embodiment.

In the production method of the present embodiment, first as shown in FIG. 7A, a resin film 12 is formed on the surface of an insulative substrate 1.

Various organic substrates similar to those described in the first embodiment may be used as the insulative substrate 1. The resin film 12 is formed by coating and drying a liquid material on the main surface of the insulative substrate 1 or bonding a resin film previously formed to the main surface of the insulative substrate 1.

The resin film 12 for use is a resin film easily removed from the surface of the insulative substrate 1 by swelling or solubilization with a particular liquid. Typical examples thereof include resin films easily soluble or swellable in organic solvent or alkaline solution. Among them, a swellable resin film is particularly preferable for accurate and easy removal.

Figure 7B:
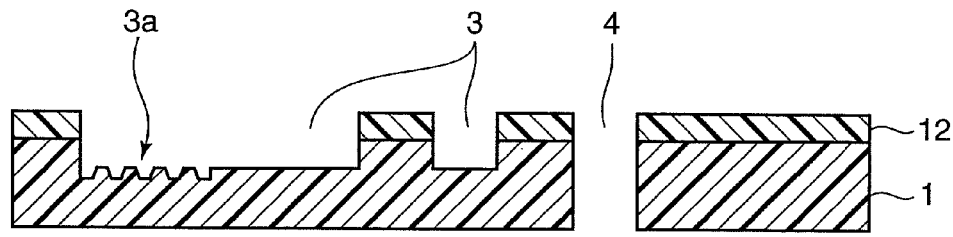

Then as shown in FIG. 7B, circuit grooves 3 having a depth greater than a thickness of the swellable resin film and as needed through-hole 4 are formed from the outermost surface of the resin film 12. If circuit grooves having a depth identical with the thickness, a circuit is formed on the surface of the insulative substrate 1.

The circuit grooves 3 are formed in a particular surface structure. Then as shown in FIG. 8B, a partial reinforcing structure 3a for example having an irregular surface (an asperity surface) is formed at least on part of the surface of the circuit grooves 3 (Circuit pattern-forming step).

Figure 7C:
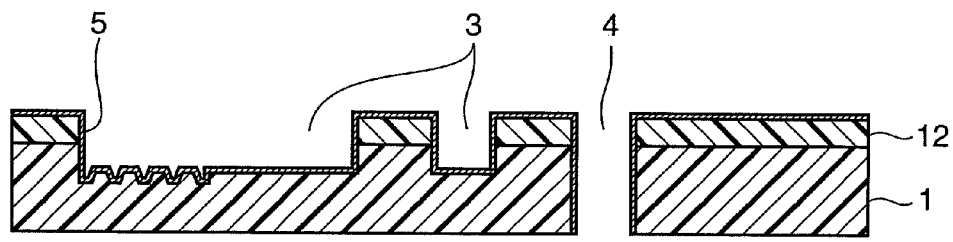

Then as shown in FIG. 7C, a plating catalyst 5 or the precursor thereof is coated on the surface of the insulative substrate 1 and the resin film 12 (catalyst-depositing step). By such plating catalyst-depositing treatment, a plating catalyst 5 is deposited on the surface of the circuit grooves 3 and through-hole 4 and on the surface of the resin film 12, as shown in FIG. 7C.

Figure 7D:
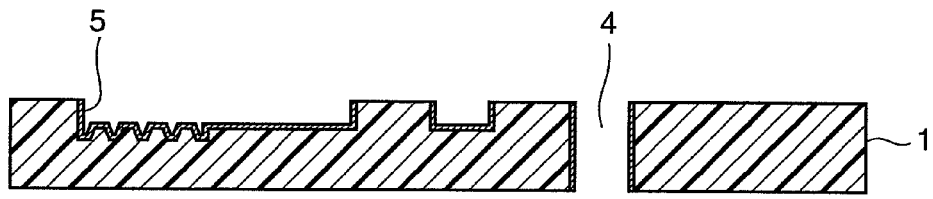

Then as shown in FIG. 7D, the resin film 12 is removed, as it is swollen or dissolved with a particular liquid (film-removing step). Removal of the resin film 12 leaves the plating catalyst 5 remaining only on the surface where the circuit is desirably formed and on the inner surface of the through-hole 4.

In the film-removing step, the resin film 12 may be removed, for example, by a method of dissolving the resin film 12 by immersion thereof for a particular period or separating the resin film 12 after swelling. The alkaline solution for use is, for example, an aqueous alkaline solution such as aqueous sodium hydroxide solution at a concentration of about 1 to 10%. The substrate is preferably ultrasonicated during immersion for improvement in removal efficiency. If the film is separated by swelling, it may be peeled off as needed under application of light force.

Figure 7E:
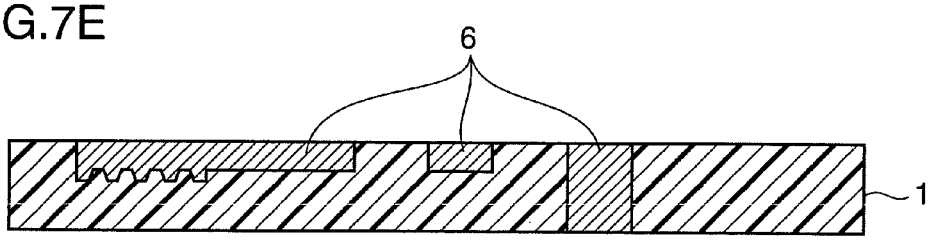

Then as shown in FIG. 7E, the film-removed insulative substrate 1 is subjected to electroless plating (plating processing step). In the step, an electroless plating film 6 is deposited on the surface of the circuit grooves 3 and the inner surface of through-hole 4.

For example, in production of circuits having land regions for surface mounting of electronic parts such as LSIs and circuit wiring regions integrated with the land regions, the land regions where electronic parts are mounted are apparently more vulnerable to breakage and separation by impact. In such a case, it is possible to improve the mounting strength when electronic parts are mounted further, by forming a partial reinforcing structure described above in the land regions that are vulnerable to impact.

An example of the partial reinforcing structure will be described with reference to drawings.

Figure 8A:
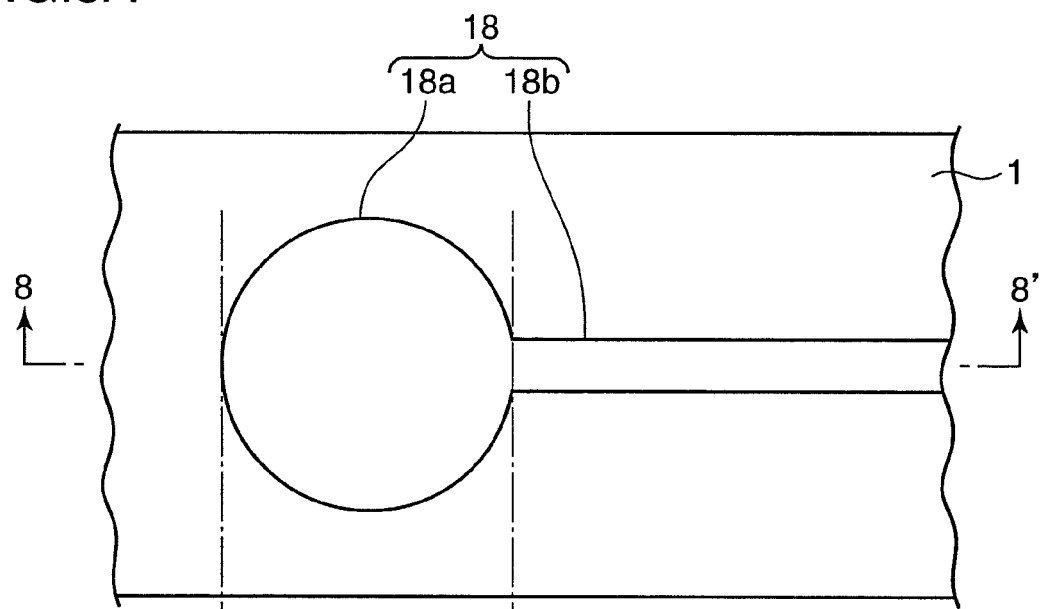
FIG. 8A is as schematic top view explaining the partial reinforcing structure formed by the production method in second embodiment.
Figure 8B:
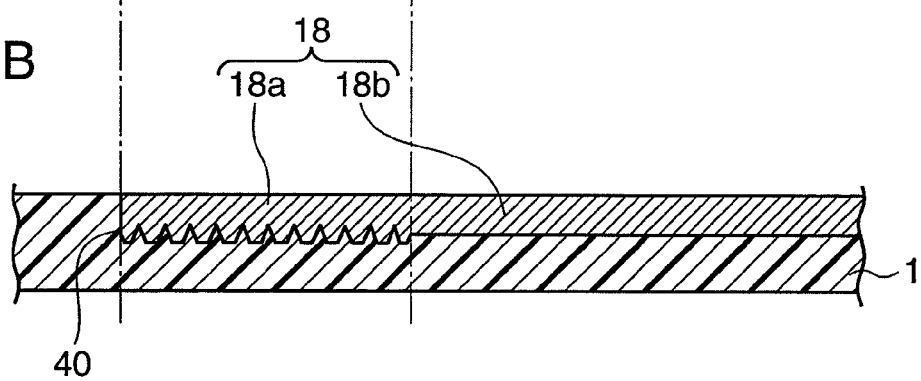
FIG. 8B is a schematic view showing the cross section, as seen along the line 8-8' in FIG. 8A.

FIGS. 8A and 8B are drawings explaining a partial reinforcing structure in the irregular shape 40 formed for exhibition of an anchoring effect. FIG. 8A is a schematic top view illustrating a circuit 18 having a land region 18a and a circuit wiring region 18b. FIG. 8B is a schematic crosssectional view as seen along the line 8-8' in FIG. 8A. It is possible to improve the adhesiveness of the circuit by anchoring effect, by forming such an irregular shape 40 in preparation of the circuit grooves on insulative substrate 1.

The irregular shape 40 shown in FIG. 8B preferably has a ten-point average roughness (Rz), for example of 0.1 to 20 µm, more preferably approximately 1 to 10 µm. Such an irregular shape formed in the region where the circuit is desirably reinforced leads to partial reinforcement of weakly wired regions.

Figure 9A:
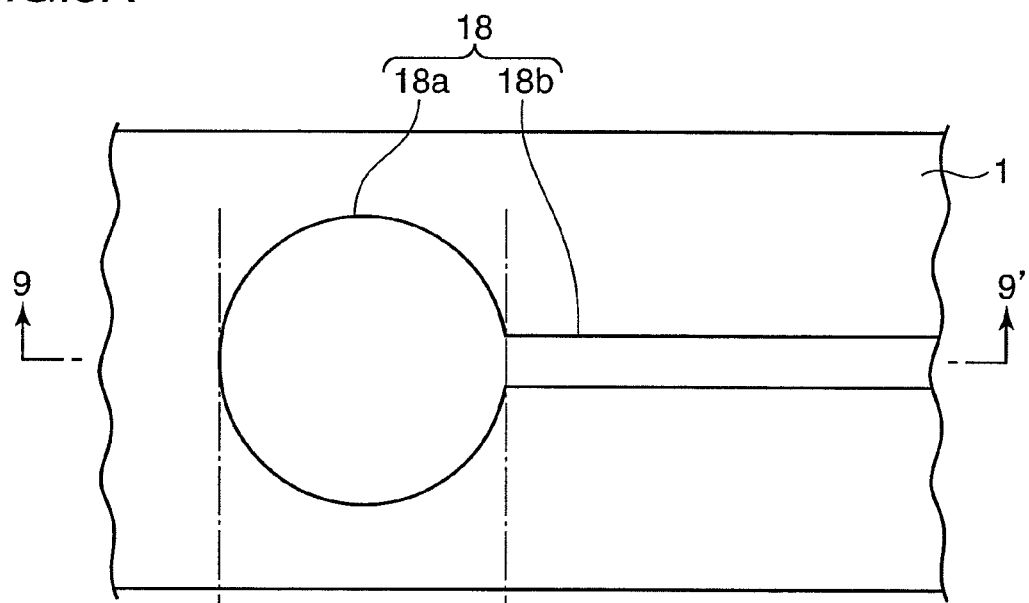
FIG. 9A a schematic top view explaining another partial reinforcing structure formed by the production method in the second embodiment.
Figure 9B:
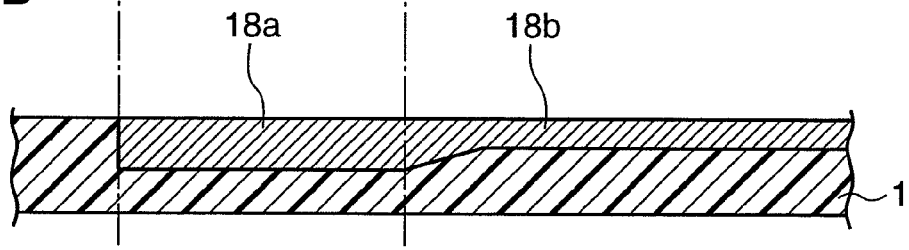
FIG. 9B is a schematic view showing the cross section, as seen along the line 9-9' in FIG. 9A.

FIGS. 9A and 9B are drawings illustrating a circuit having a region containing a thick plated film formed therein by expanding the groove depth in the region desirably reinforced. FIG. 9A is a schematic top view illustrating a circuit having a land region 18a and a circuit wiring region 18b. FIG. 9B is a schematic crosssectional view as seen along the line 9-9' in FIG. 9A. It is possible to thicken the plated film only in the region desirably reinforced, by forming the grooves deeper in the region desirably reinforced, in preparation of the circuit grooves on the insulative substrate. It is thus possible to reinforce only the weakly wired regions.

In the structure shown in FIGS. 9A and 9B, the plating in the region desirably reinforced is preferably adjusted to a thickness of 1 to 10 times, preferably 2 to 5 times, larger than that of the plating in the region not reinforced.

Figure 10:
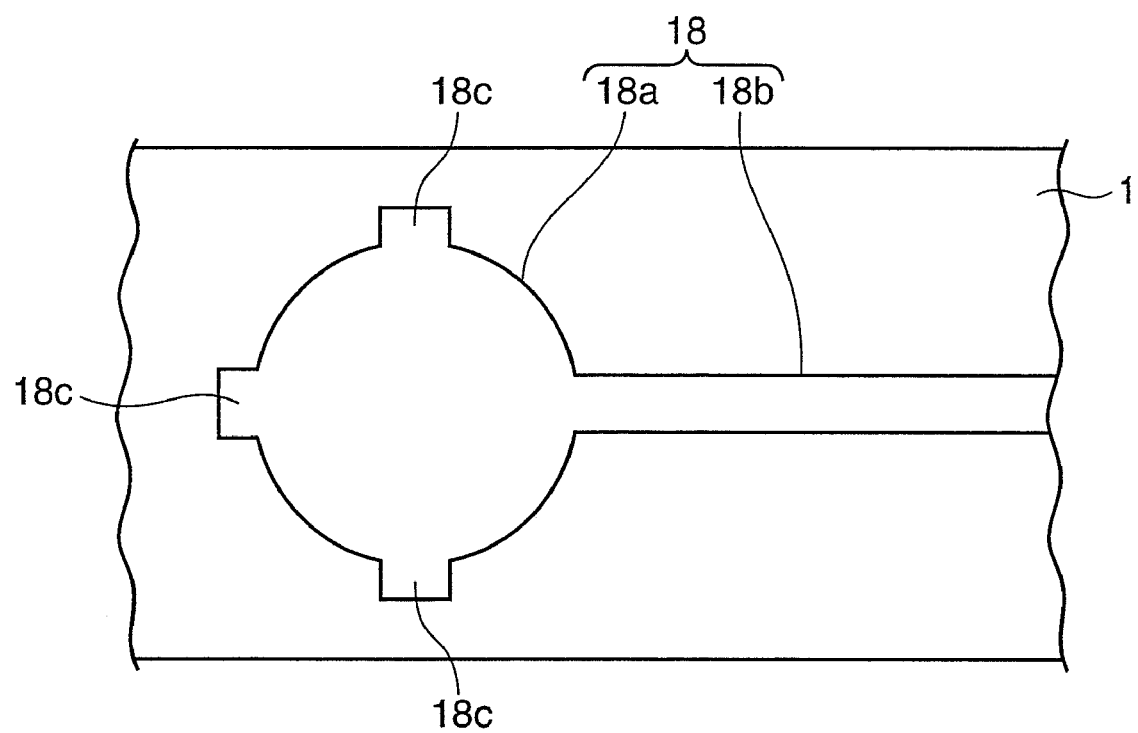
FIG. 10 is a schematic top view explaining yet another partial reinforcing structure prepared by the production method in the second embodiment.

FIG. 10 is a schematic top view illustrating a circuit having a land region 18a and a circuit wiring region 18b. The land region 18a has projections 18c formed at positions on its periphery. The projections 18c reinforce the land region 18a.

Figure 11A:
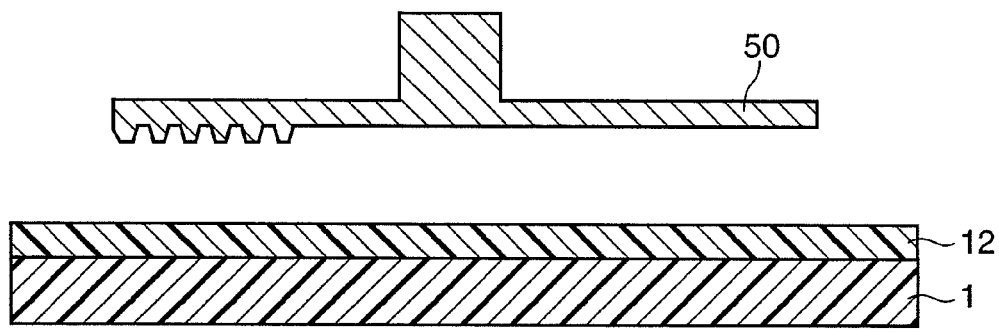
FIG. 11A to 11C are schematic views explaining the method of forming a partial reinforcing structure by embossing in the production method in the second embodiment.
Figure 11B:
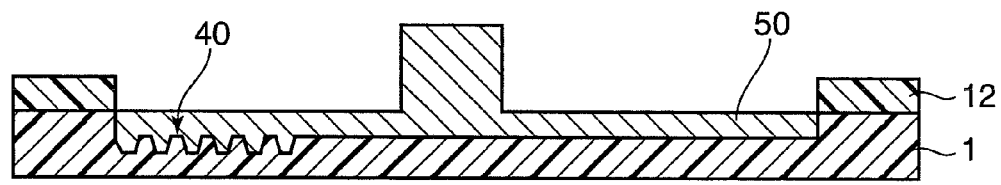
Figure 11C:
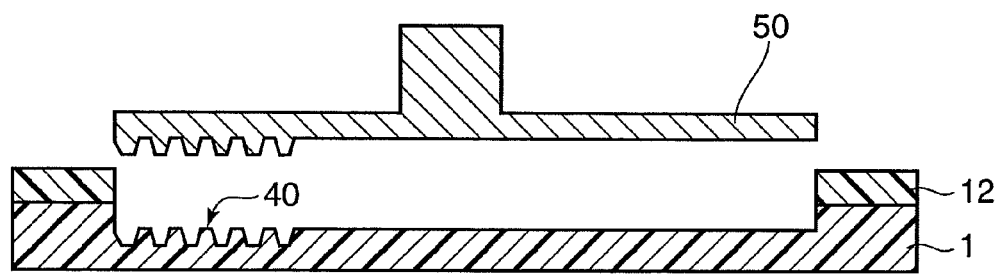

All of the reinforcement structures described above can be formed by means of laser processing, machining, or embossing during preparation of the circuit grooves. Specifically, if the partial reinforcing structure shown in FIGS. 8A and 8B is formed by laser processing, it is possible to form the irregular shape 40 by irradiating laser intermittently while the laser irradiation site is altered only on the region of substrate surface where the land region 18a is formed after the circuit patterned region 18 having the land region 18a and the circuit wiring region 18b is formed. Alternatively if embossing is used, it is possible to form an irregular shape 40 similar to that shown in FIG. 11C, by embossing the resin film 12 in the direction from the outermost surface toward the insulative substrate 1 by using a mold 50 for forming a circuit pattern having an irregular shape in the surface-region, as shown in FIGS. 11A and 11B.

As for the partial reinforcing structure similar to that shown in FIGS. 9A and 9B, the deep groove can be formed locally by raising the power of laser locally during laser processing. Alternatively, if embossing is used, it is possible to form deep grooves locally by using a mold forming deep grooves in the reinforcement region.

A partial reinforcing structure similar to that shown in FIG. 10 can also be formed by engraving projections on the periphery of the circuit during laser processing. If embossing is used, it is possible to form the projections by using a mold having projections on the periphery.

It is possible to obtain wirings partially reinforced, by forming such a partial reinforcing structure.

It is possible, by the method of producing a circuit board described above, to reinforce the metal wiring only in the damage-vulnerable region even though an electrical circuit having smaller line width and smaller line interval is formed. The circuit formed is higher in dimensional accuracy, because the plating catalyst is formed as it is deposited only in the region where the metal wiring is desirably formed. It is possible, by using such a production method for circuit, to produce circuit boards for example in single-sided, double-sided, and multilayer types, for applications, such as IC substrates, printed wiring boards for cellphone, and three-dimensional circuit boards, wherein the wire width and the wire interval of the circuit used are smaller and the circuit used often has local regions vulnerable to damage.

THIRD EMBODIMENT

Method of Producing a Capacitor-Containing Circuit Board Having a Three-Dimensional Capacitor Structure Therein As will be described below, it is also possible to form a capacitor-containing circuit board having a three-dimensional capacitor structure therein, by applying the method of producing a circuit board described in the first and second embodiments.

FIGS. 12A to 12E are schematic views respectively explaining the steps in the method of producing a circuit board having a three-dimensional capacitor structure in the third embodiment.

Figure 12A:
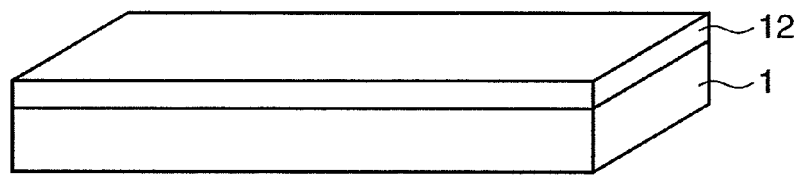
FIGS. 12A to 12E are schematic views explaining the method of producing a circuit board containing capacitors by the production method in the third embodiment.

In the production method in the present embodiment, as shown in FIG. 12A, a resin film 12 is first formed on the surface of an insulative substrate 1.

Figure 12B:
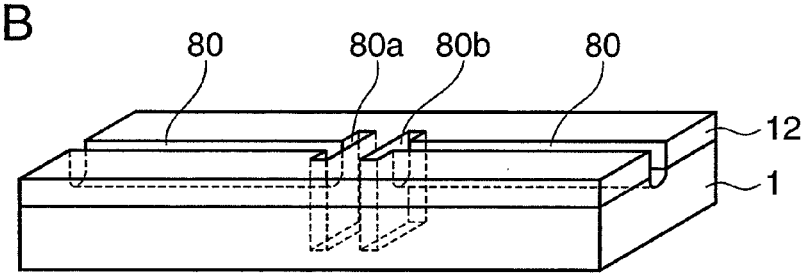

As shown in FIG. 12B, capacitor-forming grooves 80 are then formed on the insulative substrate 1, by laser processing from the outermost surface of the resin film 12. Each capacitor-forming groove 80 has two electrode units 80a and 80b facing each other. The two electrode units 80a and 80b are placed at positions facing each other via the material for the insulative substrate 1 as dielectric layer.

Figure 12C:
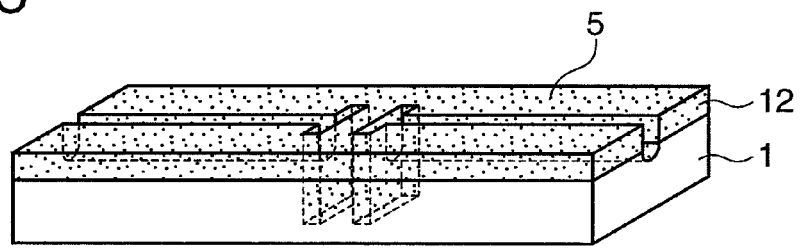

Then as shown in FIG. 12C, a plating catalyst 5 or the precursor thereof is deposited on the surface of the insulative substrate 1 carrying the capacitor-forming groove 80 formed and on the surface of the resin film 12 (catalyst-depositing step).

Figure 12D:
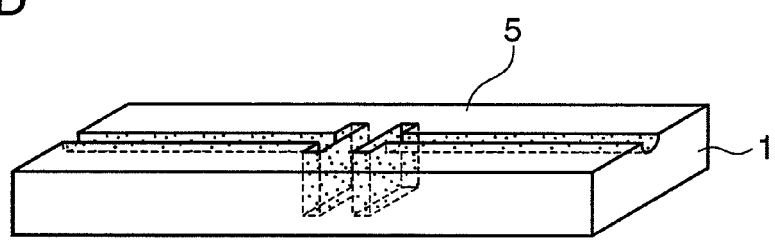

Then as shown in FIG. 12D, the resin film 12 is removed (film-removing step). Removal of the resin film 12 leaves the plating catalyst 5 remaining on the surface of the capacitor-forming grooves 80 formed on the insulative substrate 1.

Figure 12E:
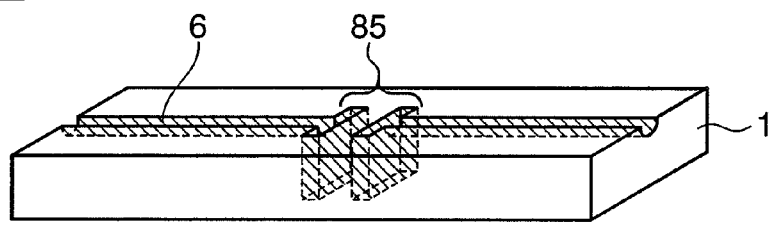
Figure 13:
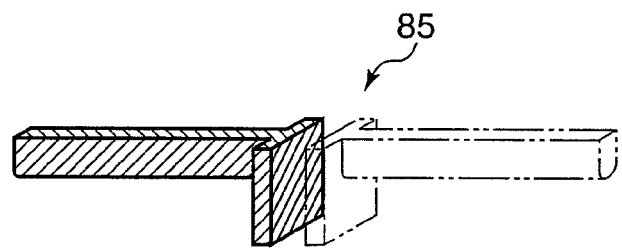
FIG. 13 is a schematic expanded drawing illustrating the capacitor region in a circuit board formed by the production method in the third embodiment.

Then as shown in FIG. 12E, the film-removed insulative substrate 1 is subjected to electroless plating (plating processing step). In the step, the electroless plating 6 is deposited only in the region of the insulative substrate 1 where the capacitor-forming grooves 80 are formed, giving a three-dimensional capacitor 85 formed on the insulative substrate 1 of circuit board. FIG. 13 is a schematic view illustrating the capacitor 85 formed.

A three-dimensionally capacitor is formed in the insulation layer of the circuit board by the production method in the present embodiment, and thus, the capacitor can be formed as it is placed in the z direction to the main face of the circuit board, thus eliminating the need for the space for mounting capacitor elements that is demanded on the surface of conventional circuit boards. Internal capacitors by using two wiring layers facing each other via the insulative layer of multilayer wiring plate as electrodes and the insulative layer as condenser layer have been known. However, such a conventional internal capacitor, which is formed on the x-y face of the multilayer wiring plate, demanded a certain amount of space. It is possible with the capacitor obtained in the present embodiment to use the space directed for mounting of capacitors as the space for circuit formation or for mounting other elements. It is possible to produce high-density circuit boards by using such a production method.

Figure 14:
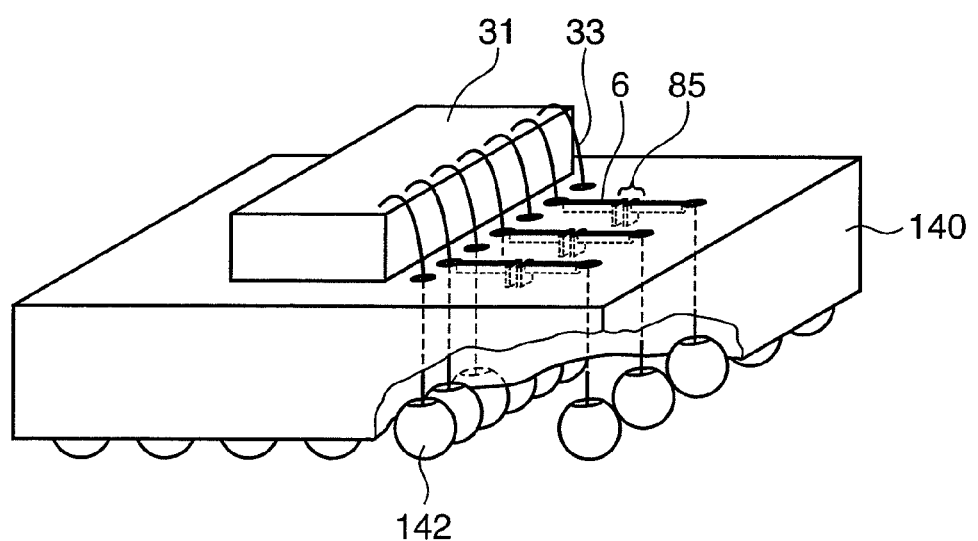
FIG. 14 is an explanatory drawing explaining applications of the circuit board containing capacitors formed by the production method in the third embodiment.

FIG. 14 is a schematic view illustrating a IC substrate 140 (circuit board) containing such a three-dimensionally capacitor 85. In FIG. 14, the IC chip 31 is mounted on the IC substrate 140 and bonded to the circuit (electroless plating 6) through wires 33. 142 represents soldering balls used for surface mounting.

FOURTH EMBODIMENT

Production of Multilayer Wiring Circuit

The additive method described in FIGS. 3A to FIG. 3E, if it is applied to the build-up method, causes the problems, as will be described below. The steps in the additive method described with reference to FIGS. 3A to 3E, if it is applied to the build-up method, will be described with reference to the schematic crosssectional views of FIGS. 15A to 15E.

Figure 15A:
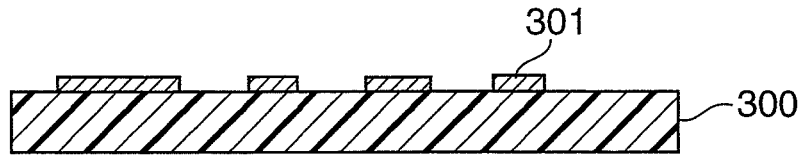
FIGS. 15A to 15E are schematic crosssectional views respectively explaining the steps used when metal wiring is formed by the additive method described in Patent Document 1, as it is applied to the build-up method.
Figure 15B:
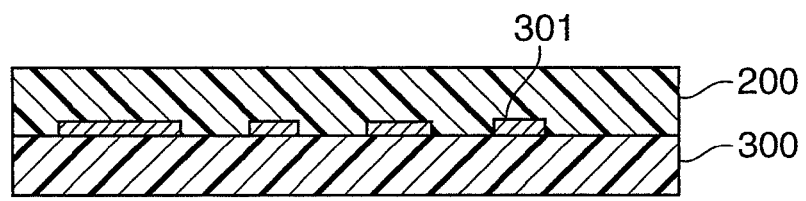
Figure 15C:
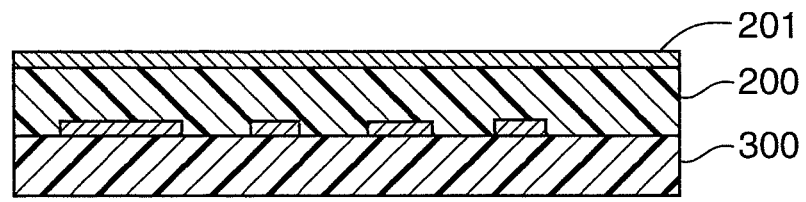
Figure 15D:
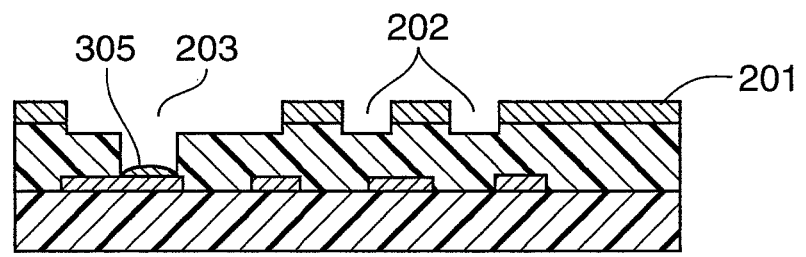
Figure 15E:
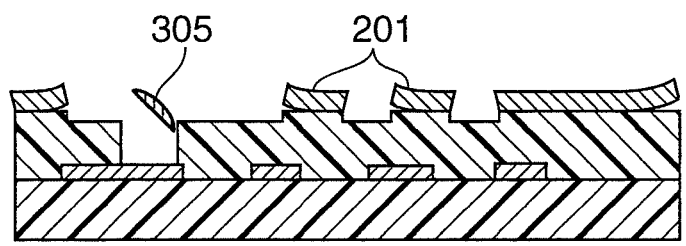

First as shown in FIG. 15A, a metal wiring 301 is formed on the surface of an insulative substrate 300. Then as shown in FIG. 15B, an insulation resin layer 200 is formed on the surface of the insulative substrate 300. As shown in FIG. 15C, a protective film 201 is then coated on the surface of the insulation resin layer 200. As shown in FIG. 15D, circuit grooves 202 and throughhole 203 corresponding to a wiring pattern are formed by laser processing on the insulation resin layer 200 carrying the protective film 201 coated. There is a resin smear 305 remaining then on the bottom of the throughhole 203 formed by laser processing. The resin smear 305, which may cause conductivity troubles, should be removed. However, as shown in FIG. 15E, desmear treatment after formation of the protective film 201 caused a problem that the protective film 201 is also swollen or dissolved together with the resin smear 305. Alternatively, desmear treatment after deposition of the plating catalyst caused a problem that the plating catalyst deposited in the region where the metal wiring is desirably formed is liberated. Therefore, it was not possible to form high-accuracy metal wiring by the method described with reference to FIGS. 15A to 15E.

Hereinafter, the method of producing a multilayer circuit board in the present embodiment will be described with reference to drawings. Description similar to that in the previous embodiment will be omitted.

FIGS. 16A to 16G are schematic crosssectional views respectively explaining the steps in the method of producing a multilayer circuit board in the fourth embodiment. In FIGS. 16A to 16G, 1 and 11 each represent an insulation layer (insulative substrate); 11a represents a first electrical circuit; 12 represents a resin film; 3 represents circuit grooves, 5 represents a plating catalyst, and 6 represents an electrolessly plated film. In addition, an conical conductive bump (conductive rod) 11b is formed at a particular position on the surface of the first electrical circuit 11a. In the present specification, the "conductive rod" is a conductive protrusion having a thickness sufficiently larger than the metal foil forming the electrical circuit that sticks out in the almost vertical direction on the surface of a electrical circuit, and the shape is not particularly limited. Thus, the shape includes columnar shapes such as cylinder and prism and also conical shapes such as so-called conductive bump.

Figure 16A:
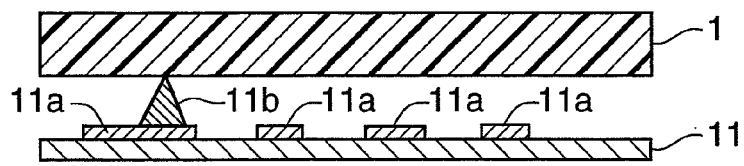
FIGS. 16A to 16G are schematic crosssectional views respectively explaining the steps in the method of producing a multilayer wiring substrate in the fourth embodiment.
Figure 16B:
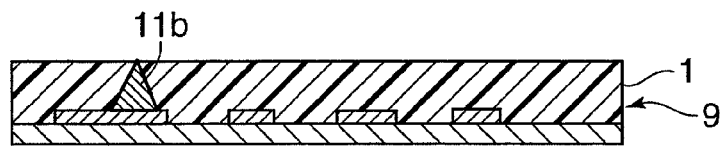

In the production method of the present embodiment, as shown in FIG. 16A, an insulative substrate 1 is first laminated on the surface of an insulative substrate 11, for enclosure of the conductive bump 11b formed protruded at predetermined position of the first electrical circuit 11a, with the insulative substrate 1. Thus, as shown in FIG. 16B, a circuit board 9 containing the conductive rod 11b formed on the first electrical circuit 11a surface as it is protruded out of the insulation layer is formed.

Various organic substrates similar to the insulative substrates described in the first embodiment may be used as the insulative substrates 1 and 11.

The insulation layer 1 may be formed by coating and hardening a resin solution on the surface of the insulation layer 11. Resin solutions commonly used in production of multilayer circuit boards, such as solutions of epoxy resin, polyphenylene ether resin, acrylic resin, polyimide resin or the like, may be used as the resin solution for use in the method without particular restriction.

Alternatively, it may be formed, for example, by placing an insulative substrate 1 over the surface of the insulation layer 11 and bonding it thereto under pressure and heat. If a prepreg is used as the insulative substrate 1, the hardening under pressure and heat is preferable.

In the present embodiment, the first electrical circuit 11a is formed on the surface of the insulative substrate 11. In addition, a conductive bump 11b is formed, as it protrudes at a particular position on the surface of the first electrical circuit 11a. The first electrical circuit 11a is formed by a traditionally known circuit-forming method such as subtractive method or additive method.

The conductive bump 11b may be formed by screen-printing a conductive paste on the surface of the first electrical circuit 11a. Specifically, for example, a conductive paste such as silver paste is applied at a particular position on the surface of the first electrical circuit 11a by screen printing. If desired thickness is not obtained by single printing, the thickness of the conductive paste may be increased by repeated application by screen printing. And, the conductive bump is formed by application of a conductive paste at a particular position, molding thereof in the half-hardened state, for example, into a conical shape and subsequent hardening of the shaped molding. Alternatively, the conductive paste may be formed at a particular position, hardened and then molded into a particular shape for example by etching process, instead of the molding in the half-hardened state. Yet alternatively, the conductive bump may be formed by etching a relatively thick metal foil by photoresist method. Yet alternatively, the conductive bump may be formed on a metal foil surface by plating process.

The shape, size, interval and others of the conductive bumps 11b are not particularly limited. Specifically, the bump may be, for example, in an almost conical shape having a height of approximately 5 to 200 μm and a bottom face diameter of approximately 10 to 500 μm.

Figure 17A:
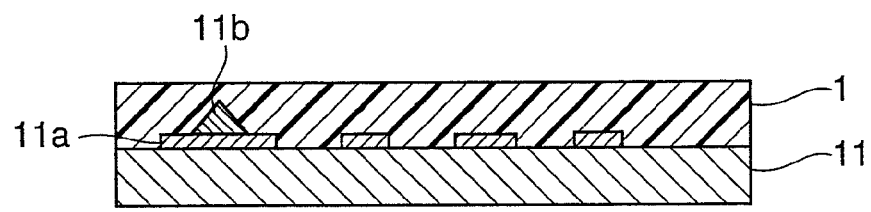
Figure 17B:
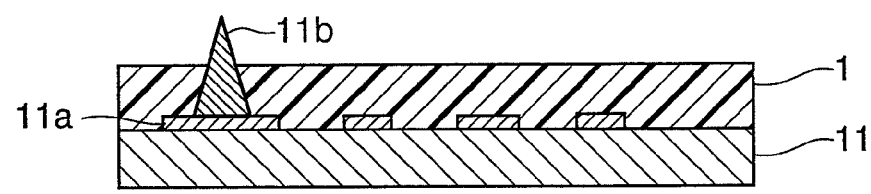
FIG. 17B is a schematic crosssectional view illustrating a conductive bump placed as it is penetrating in and sticking out of the insulation layer with its head exposed.

The shape of the embedded conductive bump 11b is not particularly limited, and, for example, the head of the conductive bump 11b may be embedded completely in the insulative substrate 1 without external exposure, as shown in FIG. 17A, or the conductive bump 11b may be inserted into the insulative substrate 1, leaving only the head of the conductive bump 11b exposed, as shown in FIG. 17B.

Figure 16C:
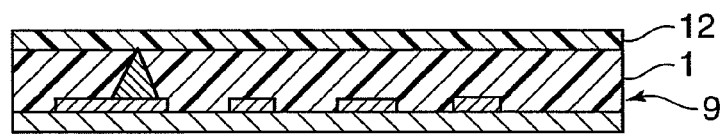

As shown in FIG. 16C, a resin film 12 is the formed on the main surface of the circuit board 9 containing the conductive rod (on the surface of the insulation layer 1 facing the protruding conductive bump 11b) (film-forming step).

The resin film 12 formed is a film similar to that described in the second embodiment.

Figure 16D:
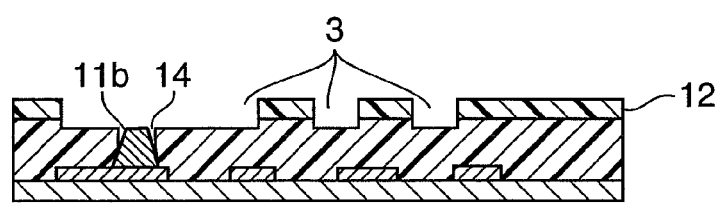

Then as shown in FIG. 16D, circuit grooves 3 having a depth larger than the thickness of the resin film 12 are formed on the external surface of the resin film 12 by laser processing (circuit groove-forming step).

Figure 18:
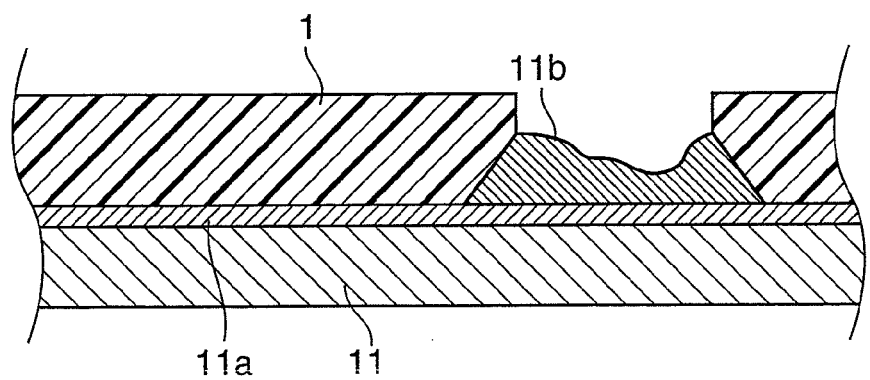
FIG. 18 is a schematic crosssectional view explaining the conductive bump in the fourth embodiment with its top region hollowed and removed.

As shown in FIG. 16D, the conductive bump 11b is exposed by laser processing from the outermost surface side of the resin film 12 (conductive rod-exposing step). The conductive bump 11b is preferably exposed by removing the top region and leaving the bottom digged region of the conductive bump 11b remaining exposed, for sufficient removal of the surface smear, as shown in FIG. 18. The conductive bump 11b has a thickness sufficiently larger than that of the first electrical circuit 11a. Accordingly, even if the conductive bump 11b is processed with laser at high strength, the first electrical circuit 11a itself remains undamaged. It is thus possible to remove the smear on the surface of the conductive bump 11b completely by exposing the conductive bump 11b in such a manner. Therefore, it is possible, by laser processing and the plating treatment described below after exposure of the conductive bump 11b, to connect the exposed conductive bump 11b and the newly formed second electrical circuit 8 to each other by interlayer connection with the plated film without desmear treatment.

Figure 16E:
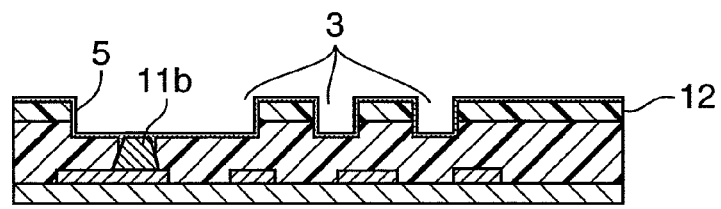

Then as shown in FIG. 16E, a plating catalyst 5 or the precursor thereof is deposited on the entire outer surface of the conductive bump 11b exposed by laser processing, the circuit groove 3 and the resin film 12 (catalyst-depositing step).

The plating catalyst 5 for use is a catalyst similar to that described in the first embodiment, and the deposition method for use is also similar to that described there.

Figure 16F:
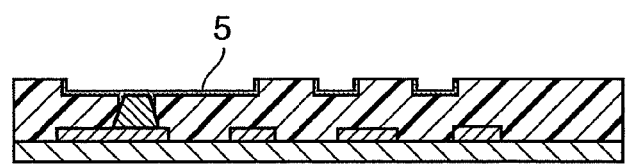

As shown in FIG. 16E, the plating catalyst 5 is deposited by the catalyst-depositing treatment on the entire surface both of the laser-processed region and non-laser-processed resin film 12. Then as shown in FIG. 16F, the resin film 12 is removed, as it is swollen or dissolved with a particular liquid (film-removing step). The step leaves the plating catalyst 5 remaining only on the surface of the circuit groove 3 formed by laser processing and the exposed conductive bump 11b. On the other hand, the plating catalyst 5 deposited in the other region (surface of resin film 12) is removed.

Figure 16G:
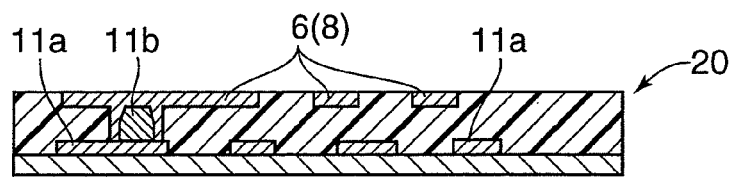

The film-removing step is carried out by a method similar to that described in the second embodiment. Then as shown in FIG. 16G, an electrolessly plated film is formed in the region carrying the residual plating catalyst 5 after the film-removing step (plating processing step). It is possible in the step to deposit an electrolessly plated film only in the region where the second electrical circuit 8 is desirably formed. Also in the step, the newly formed higher-layer second electrical circuit 8 and the lower-layer first electrical circuit 11a are connected to each other via the conductive bump 11b and the electrolessly plated film 6 by interlayer connection.

The electrolessly plated film may be formed, for example, by a method of immersing the conductive rod-containing circuit board 9 after the film-removing step in an electroless plating solution and thus, allowing deposition of an electrolessly plated film 6 only in the region where the plating catalyst 5 is deposited.

The metal for use in the electroless plating is a metal similar to that described in the first embodiment.

In the plating processing step, the electrolessly plated film 6 can be deposited only in the region on the surface of the laser-processed insulation layer 1. In this way, a second electrical circuit 8 is formed on the insulation layer 1 surface, and the formed second electrical circuit 8 and the first electrical circuit 11a are connected to each other via the conductive bump 11b by interlayer connection.

A multilayer circuit board 20 shown in FIG. 16G having the second electrical circuit 8 on the surface of the insulation layer 1 is formed in the steps above. In the multilayer circuit board 20, the higher-layer second electrical circuit 8 is electrically connected via the conductive bump 11b and the electrolessly plated film 6 to the lower-layer first electrical circuit 11a.

Figure 19:
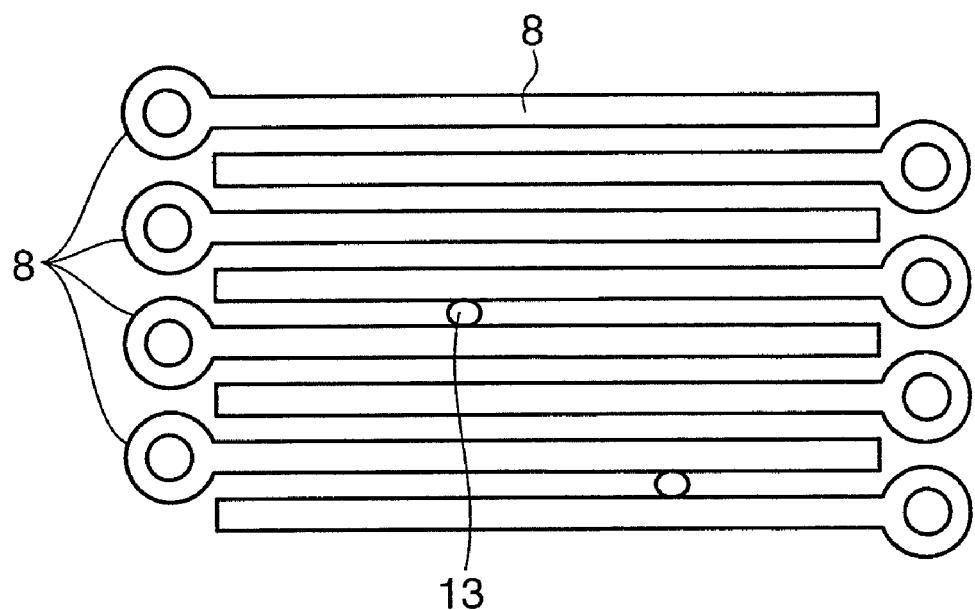
FIG. 19 is a schematic top view illustrating the circuit-formed face of the substrate, for explaining the inspection step of explaining the film remaining on the face after film-removing step in the fourth embodiment.

In the method of producing a circuit board, it is possible to determine film-removing failures by adding a fluorescent substance to the resin film and examining emission of the fluorescent substance after the film-removing step described above by irradiating UV light or near-ultraviolet light onto the test face. It is possible by the method of producing a circuit board in the present embodiment to form metal wires having an extremely small wire width and wire interval. In such a case, there is a concern, for example, about the resin film between neighboring metal wires remaining incompletely removed, as shown as the resin film residue 13 in the expanded top view of circuit 8 in FIG. 19. The resin film remaining between the metal wires, which allows formation of a plated film in the region, may possibly lead to troubles such as migration and short circuiting. In such a case, it is possible to examine the presence and the position of the film-removing failures by adding a fluorescent substance to the resin film 12, irradiating the film-removed face with light from a particular light source after the film-removing step, and thus, allowing light emission by the fluorescent substance only in the film-remaining region.

The fluorescent substance added to resin film for use in the inspection step is not particularly limited, if it emits light by irradiation of light from a particular light source. Typical examples thereof include fluoresceine, eosine, pyronine G and the like.

The region where the emission of the fluorescent substance is observed in the inspection step is the region having the residual resin film 13. Accordingly, it is possible to prevent formation of a plated film in the region by removing the emission-detected region, thus, prohibiting troubles such as migration and short circuiting in advance.

By the method of producing a multilayer circuit board described above, it is possible, by forming am electrolessly plated film by subjecting the conductive bump formed on the lower-layer first electrical circuit to laser processing in production of a multilayer circuit board by laminating electrical circuits by build-up method, to connect the newly formed higher-layer second electrical circuit to the previously-formed lower-layer first electrical circuit easily by interlayer connection. In addition, the newly-formed second electrical circuit, which is formed by deposition of a plating catalyst only in the region where the metal wires are desirably formed, is an electrical circuit higher in dimensional accuracy. It is thus possible to provide a multilayer circuit board carrying a electrical circuit higher in dimensional accuracy. It is possible by using such a method of producing a multilayer circuit board to produce multilayer circuit boards for use in applications such as IC substrates having small wire width and wire interval and printed wiring boards for cellphone and 3D circuit board.

Hereinafter, the production method in the present embodiment will be described more specifically with reference to an Example. It should be understood that the scope of the present invention is not restricted at all by the following Example.

Example 2

A circuit board carrying a metal wiring (thickness 18 μm) formed on the surface is placed over a prepreg having a thickness 100 μm. A conical conductive bump having a height of 50 μm and a bottom face diameter of 200 μm is formed at a particular position on the metal wiring surface. The conductive bump is a bump formed with a conductive paste. A laminated film of the laminated and integrated composite is obtained by press-molding the composite under heat in the state that the conductive bump sticks into the prepreg.

Then, a suspension of styrene-butadiene copolymer (SBR) in methylethylketone (MEK) (manufactured by Zeon Corp., particle diameter: 200 nm, solid matter: 15%) was coated on the prepreg-sided surface of the obtained laminated film by spin coating and dried at 80° C. for 30 minutes, to form a resin film having a thickness of 2 μm.

Grooves having the almost rectangular cross section having a width of 20 μm and a depth of 30 μm are formed by laser processing at particular positions of the laminate film carrying the resin film formed. In addition, holeis formed in such a manner that the conductive bump is exposed as it is dug toward the region where the conductive bump is formed. A UV-YAG laser of MODEL5330 manufactured by ESI is used in laser processing.

The laser-processed laminated film is then immersed in a cleaner conditioner-(C/N3320) and washed with water. It is further treated in a predip step by using PD404 (manufactured by Shipley Far East Ltd.), for prevention of decomposition of the deposited tin-palladium colloid.

It is then immersed in a catalyst solution (CAT44, manufactured by Shipley Far East Ltd.), for deposition of palladium, nuclei in electroless copper plating, in the state of tin-palladium colloid on the epoxy resin substrate.

The laminate is then immersed in an accelerator solution (ACC19E, manufactured by Shipley Far East Ltd.), to generate palladium nuclei. The laminate is immersed in 5% aqueous sodium hydroxide solution under ultrasonication for ten minutes, allowing swelling of the surface SBR film and separation of the resin film.

Ultraviolet light is then irradiated onto the laminate surface. There is local fluorescent emission observed by ultraviolet irradiation. The region of fluorescent emission is removed by rubbing with cloth.

The laminate is subjected to electroless copper plating as it is immersed in an electroless plating solution (CM328A, CM328L, CM328C, manufactured by Shipley Far East Ltd.), to give a deposited electroless copper plated film having a thickness of 5 μm. Observation of the surface of the laminated film electrolessly plated as described above under SEM (scanning electron microscope) shows that metal wires formed by the electrolessly plated film are formed at high accuracy in the laser-processed groove regions and the surface of the conductive bump and the groove region are electrically connected to each other via the electrolessly plated film.

The swelling degree of the swellable resin film is determined in a similar manner to the method described in the first embodiment.

FIFTH EMBODIMENT

Preparation of Multilayer Wiring Circuit Containing Radiators

The method of producing a circuit board in the present embodiment relates to a method of producing a radiator penetrating the multilayer circuit, while the method of producing a multilayer circuit board in the fourth embodiment is applied.

Hereinafter, the method of producing a multilayer circuit board having penetrating radiators in the present embodiment will be described with reference to drawings. Description similar to that in the fourth embodiment will be omitted.

FIGS. 20A to 20G are schematic crosssectional views respectively explaining the steps in the method of producing a multilayer circuit board having radiators penetrating through multiple layers in the fifth embodiment. The regions in the fifth embodiment with the same numerals as those in the first to fourth embodiments are similar to each other, and thus, the detailed description thereof is omitted.

The production method of the present embodiment is different from the production method described in the fourth embodiment in that conductive film for heat radiations 16a electrically disconnected from the first electrical circuit 11a are formed additionally on the face where the first electrical circuit is formed. Also at predetermined positions of the conductive film for heat radiation 16a, conductive rods 16b are formed as they are protruding in the shape similar to the conductive rods 11b placed protruding on the surface of the first electrical circuit 11a.

Figure 20A:
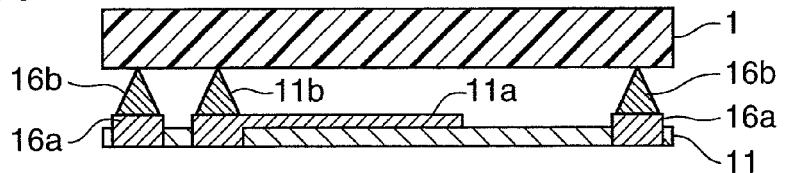
FIGS. 20A to 20G are schematic crosssectional views explaining the method of producing a multilayer circuit board containing a radiator described in the fifth embodiment.
Figure 20B:
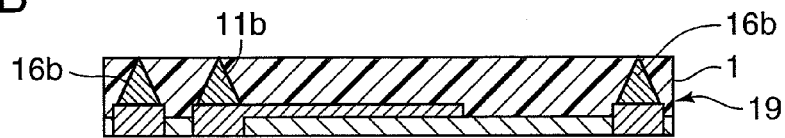

Also in the production method of the present embodiment, as shown in FIG. 20A, an insulative substrate 1 is first laminated on the surface of an insulative substrate 11. Then as shown in FIG. 20B, the conductive bumps 11b and the conductive bumps 16b are embedded in the insulative substrate 1.

Figure 20C:
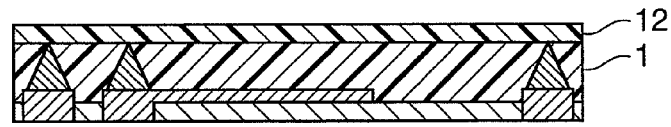

As shown in FIG. 20C, a resin film 12 is then formed on the main face of the circuit board 19 having conductive rods (film-forming step).

Figure 20D:
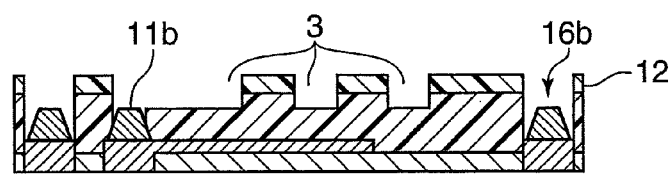

Then as shown in FIG. 20D, a circuit groove 3 having a depth equal to or greater than the thickness of the resin film 12 are formed by laser processing from the external surface of the resin film 12 (circuit groove-forming step). Further as shown in FIG. 20D, the conductive bumps 11b and the conductive bumps 16b are exposed by laser processing from the external surface of the resin film 12 (conductive rod-exposing step).

Figure 20E:
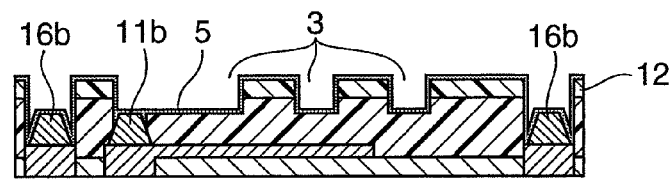

Then as shown in FIG. 20E, a plating catalyst 5 or the precursor thereof is deposited over the entire surface of the conductive bumps 11b and 16b exposed by laser processing, the circuit groove 3 and the resin film 12 (catalyst-depositing step). By the catalyst-depositing treatment, the plating catalyst 5 is deposited on the entire surface, including the surface of the laser-processed region and also of the non-laser-processed resin film 12.

Figure 20F:
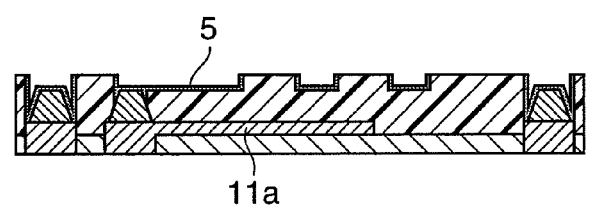

Then as shown in FIG. 20F, the resin film 12 is removed, as it is swollen or dissolved with a particular liquid (film-removing step).

Figure 20G:
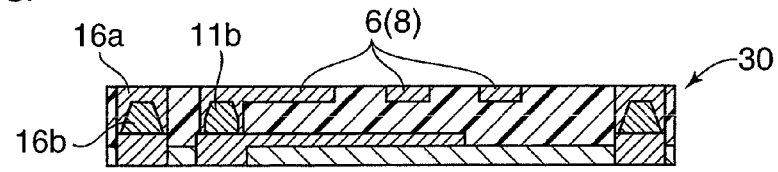

As shown in FIG. 20G, electrolessly plated films are then formed on the regions where the plating catalyst 5 remains unremoved (plating processing step). In the step, the electrolessly plated film 6 is deposited only in the region where the plating catalyst 5 remains unremoved. The newly formed higher-layer second electrical circuit 8 and the lower-layer first electrical circuit 11a are connected to each other via the conductive bumps 11b and the electrolessly plated films 6 by interlayer connection. In addition, a new conductive films for heat radiation 16a thermally connected to the lower-layer conductive film for heat radiation 16a are formed on the face carrying the newly formed higher-layer second electrical circuit 8.

After such steps, formed is a multilayer circuit board 30 having a second electrical circuit 8 and newly formed conductive films for heat radiation 16a on the surface of the insulation layer 1 shown in FIG. 20G. In the multilayer circuit board 30, the higher-layer second electrical circuit 8 is electrically connected to the lower-layer the first electrical circuit 11a via the conductive bumps 11b and the electrolessly plated films 6. The higher-layer conductive film for heat radiation 16a is thermally connected via the conductive bumps 16b and the electrolessly plated films 6 to the lower-layer conductive film for heat radiation 16a.

Figure 21:
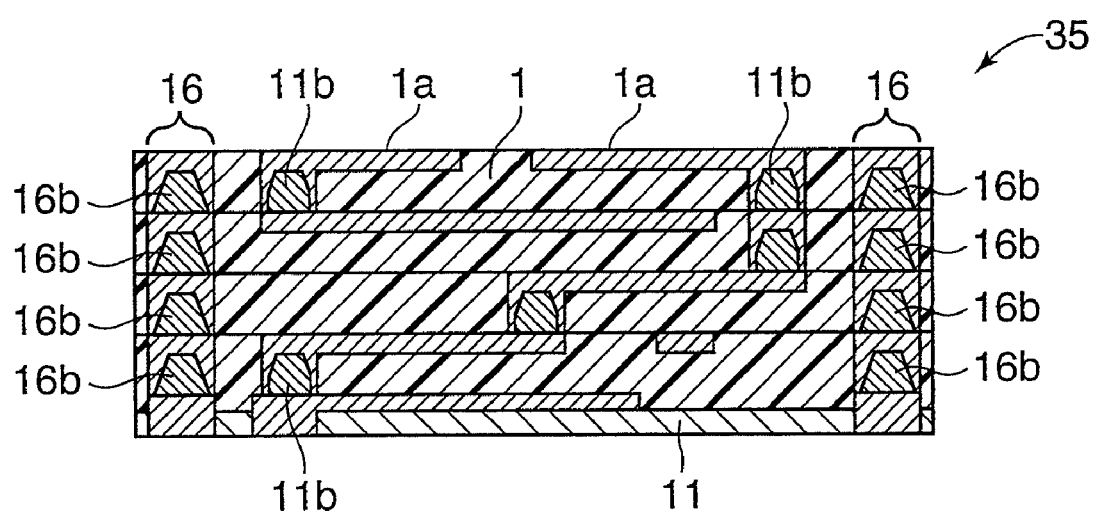
FIG. 21 is a schematic crosssectional view illustrating an example of the multilayer circuit board containing a radiator obtained by the production method described in the fifth embodiment.

Conductive bumps 16b are formed additionally in the newly formed higher-layer conductive film for heat radiation 16a shown in FIG. 20G, and conductive bumps 11b are additionally formed at predetermined positions of the second electrical circuit 8. A multilayer circuit board having a radiator penetrating multiple layers therein is obtained, by repeating the steps explained in FIGS. 20A to 20G for a particular times. FIG. 21 shows, as an example, a schematic crosssectional view of a five-layered multilayer circuit board 35 prepared by repeating the steps shown in FIGS. 20A to 20G four times.

Radiators 16 penetrating the insulative substrate 11 and the five-layered insulation layer are formed in the five-layered multilayer circuit board 35 shown in FIG. 21. The radiators 16, which penetrate the multilayer circuit board 35, transfer the heat on top surface to the bottom surface efficiently. Thus, the multilayer circuit board containing the radiators can be used favorably, for example, as an IC substrate for mounting IC chips that release a great amount of heat and a LED substrate carrying LEDs of which the luminous efficiency is affected by heat generation.

Figure 22:
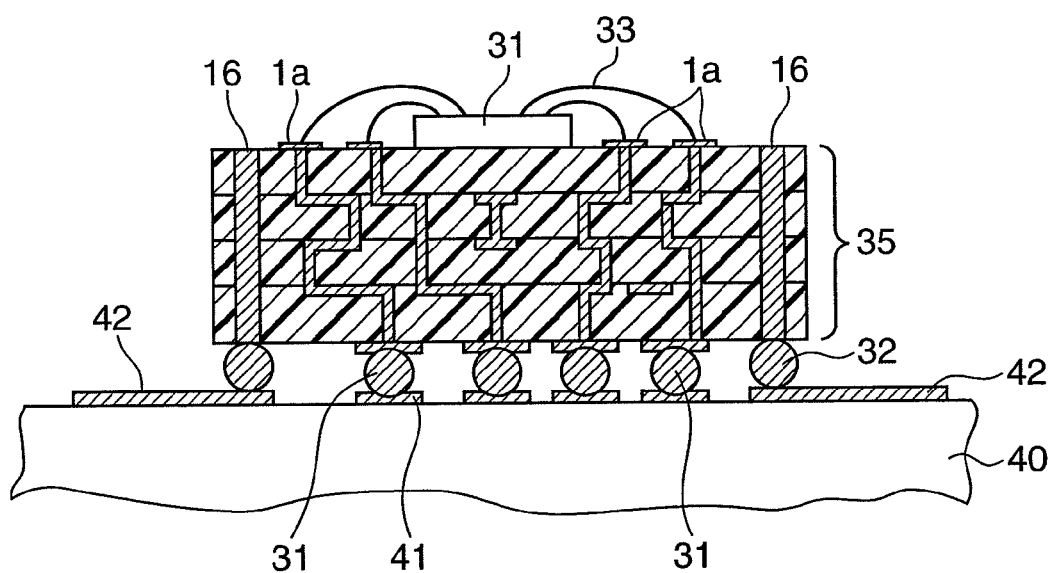
FIG. 22 is a schematic crosssectional view illustrating a multilayer circuit board containing a radiator when used as an IC substrate.
Figure 23:
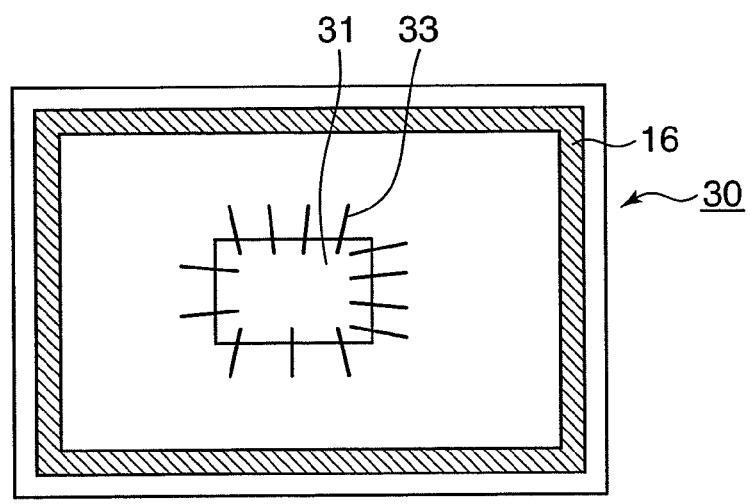
FIG. 23 is a top-face crosssectional view illustrating a multilayer circuit board, for explaining the location of the radiator.

Use of a multilayer circuit board 35 containing radiators 16 as IC substrate will be described with reference to FIGS. 22 and 23. FIG. 22 is a schematic crosssectional view illustrating a multilayer circuit board 35 carrying an IC chip 31 mounted thereon. FIG. 23 is a top view illustrating the multilayer circuit board 35 shown in FIG. 22 carrying a chip 31 mounted thereon.

In FIG. 22, the multilayer circuit board 35 is connected via the electrode bumps 31 on the rear face to the electrode land regions 41 on the surface of the printed wiring board 40 by soldering. Radiator bumps 32 thermally connected to the radiators 16 are formed on the rear face of the multilayer circuit board 35. The radiator bumps 32 are connected to metal layers 42 for heat release formed on the printed wiring board 40 by soldering. The metal layers for heat release 42 are formed, electrically insulated from the circuit formed on the surface of the printed wiring board 40.

The IC chip 31 mounted on the multilayer circuit board 35 generates heat if power is supplied to the IC chip 31 through wires 33 for wire bonding. The multilayer circuit board 35 can transfer the heat released from the IC chip 31 via the radiators 16 to the metal layers 42 formed on the surface of the printed wiring board 40. Accordingly, the heat released from the IC chip 31 is radiated efficiently through the metal layers 42 formed on the surface of the printed wiring board 40, thus, preventing deterioration in operation efficiency of the IC chips 31.

The shape, pattern and others of the radiators formed on the multilayer circuit board are not particularly limited, if the radiators are formed, as they are electrically insulated from the circuit formed in the multilayer circuit board. It is possible to make the radiator function as a reinforcement structure for prevention of thermal deformation of the multilayer circuit board, by properly selecting the shape and pattern of the radiator. If the insulation layer of the multilayer circuit board is made of an organic material, the layer may be thermally deformed by the heat during soldering. In such a case, for example, if a radiator 16 in the frame-shaped pattern shown in FIG. 23 is formed along the external surface of the multilayer circuit board 30, the radiator 16 of a metal material having a linear thermal expansion coefficient lower than that of the resin material functions as a reinforcement structure, preventing deformation of the entire multilayer circuit board 30.

SIXTH EMBODIMENT

Another Method of Producing Multilayer Wiring Circuit

In the sixth embodiment, another method of producing a circuit board containing conductive rods will be described.

The steps except those for production of a circuit board containing conductive rods are the same as the steps described in the fourth and fifth embodiments, and the detailed description thereof is eliminated.

The method of producing a multilayer circuit board having conductive rods in the sixth embodiment will be described with reference to FIGS. 24A to 24E.

In FIGS. 24A to 24E, 1 and 21 each represent an insulation layer (insulative substrate); 21a represents a first electrical circuit; 24 represents a hole formed by laser processing; 25 represents a smear; and 27 represents a conductive rod.

Figure 24A:
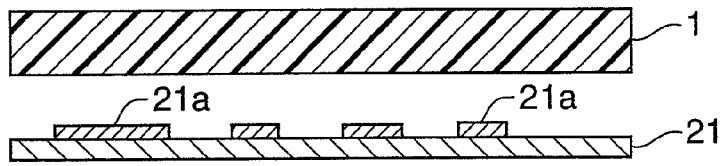
FIGS. 24A to 24E are stepwise crosssectional views explaining the method of producing a multilayer circuit board containing conductive rods in the sixth embodiment of the present invention.
Figure 24B:
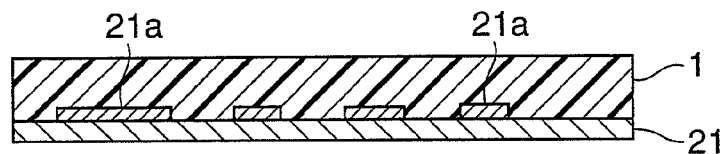
Figure 24C:
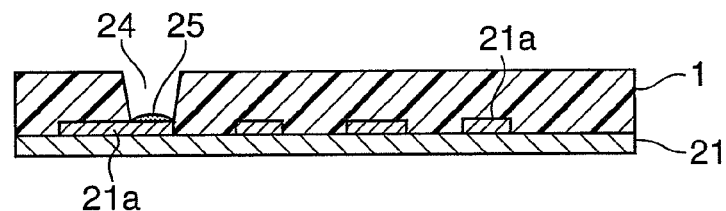
Figure 24D:
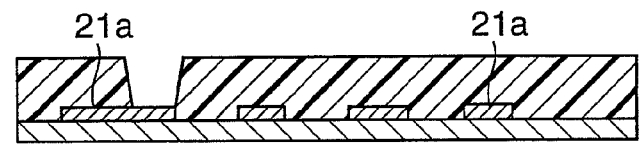

In the production method of the present embodiment, as shown in FIGS. 24A and 24B, an insulation layer 1 is first laminated on the surface of an insulation layer 21 carrying a first electrical circuit 21a formed. As shown in FIG. 24C, the surface of the first electrical circuit 21a is exposed by laser processing of the insulation layer 1. A resinous residue smear 25 remains deposited on the surface of the first electrical circuit 21a exposed by laser processing, as shown in FIG. 24C. The smear 25 may cause conductivity troubles. For that reason, the smear 25 is preferably removed by desmear treatment, as shown in FIG. 24D. A known method of removing the smear 25 by solubilization by means of immersion for example in permanganic acid solution can be used without any restriction as the desmear treatment.

Figure 24E:
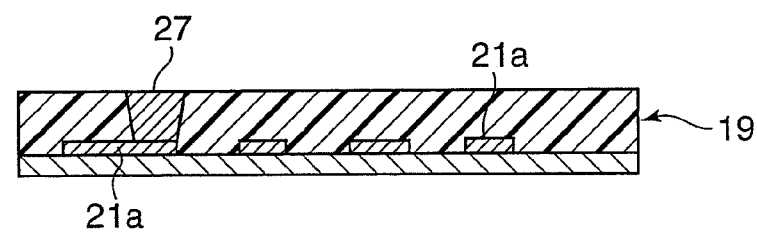

After desmear treatment, a plate layer is grown from the surface of the exposed first electrical circuit 21a by electrolytic or electroless plating. As a result, as shown in FIG. 24E, a conductive rod 27 is formed as it protrudes on the surface of the first electrical circuit 21a. The first electrical circuit 21a functions as an electrode when electrolytic plating is performed, while the surface of the first electrical circuit 21a functions as plating nucleus, when electroless plating is performed.

A multilayer circuit board is obtained in steps similar to those described in the fourth or fifth embodiment, except that a circuit board containing conductive rods 19 such as that described above is used, replacing the circuit board containing conductive rods 9. Specifically, a resin film 12 is formed on the surface of a circuit board containing conductive rods 19 (film-forming step). Circuit grooves 3 having a depth larger than the thickness of the resin film 12 are formed by laser processing from the external surface of the resin film 12 (circuit groove-forming step). The conductive rod 27 is exposed by laser processing from the external surface of the resin film 12 (conductive rod-exposing step). A plating catalyst 5 or the precursor thereof is deposited over the entire surface of the exposed conductive rod 27 and circuit groove 3, and the resin film 12 (catalyst-depositing step). The resin film 12 is then removed (film-removing step). After the film-removing step, an electrolessly plated film 6 is formed in the region where the plating catalyst 5 remains unremoved (plating processing step). A multilayer circuit board having a second electrical circuit 8 on the surface of an insulation layer 1 is formed after these steps. In the multilayer circuit board, the higher-layer second electrical circuit 8 is electrically connected via the conductive rods 27 and the electrolessly plated films 6 to the lower-layer the first electrical circuit 21a.

In such a method, the surface of the first electrical circuit may be subjected to desmear treatment before preparation of the resin film, and then, the conductive rod for interlayer connection formed by electrolytic plating or electroless plating. Thus, there is no concern, for example, about generation of the resin film by desmear treatment. It is also possible to form a conductive rod more efficiently, if the plated film is grown by electrolytic plating by using the exposed first electrical circuit as electrode. If power application to the first electrical circuit is difficult, the plated film may be grown by electroless plating by using the exposed electrical circuit surface as plating nucleus.

SEVENTH EMBODIMENT

Another Method of Producing Multilayer Wiring Circuit

In the seventh embodiment, a method of forming conductive rods for interlayer connection after separation of the resin film 12 and formation of the second electrical circuit, instead of using conductive rods formed before preparation of the resin film 12 described in the fourth to sixth embodiments. Detailed description the steps similar to those described in the fourth to sixth embodiments will be omitted.

Figure 25A:
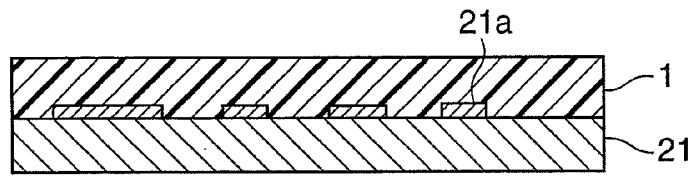
FIGS. 25A to 25F are stepwise crosssectional views explaining the first half steps in the method of producing a multilayer wiring substrate in the seventh embodiment of the present invention.

In the production method of the present embodiment, as shown in FIG. 25A, an insulation layer 1 is first laminated on the surface of an insulative substrate 21 In this way, the first electrical circuit 21a is embedded in the insulation layer 1.

Figure 25B:
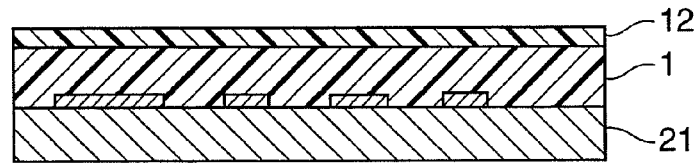
Figure 25C:
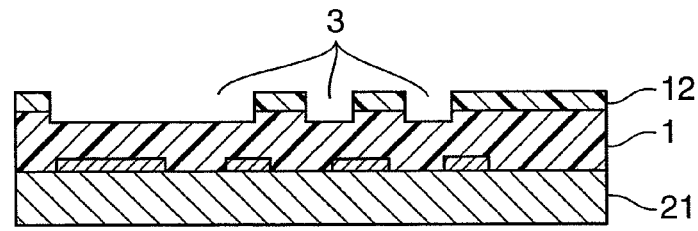

Then as shown in FIG. 25B, a resin film 12 is formed on the surface of the insulation layer 1 (film-forming step). As shown in FIG. 25C, circuit grooves 3 having a depth of greater than the thickness of the resin film 12 are formed on the external surface of the resin film 12 by laser processing (circuit groove-forming step).

Figure 25D:
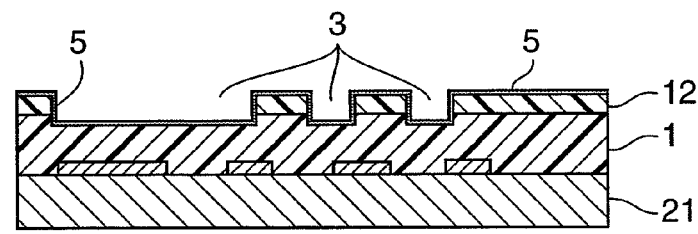

Then as shown in FIG. 25D, a plating catalyst 5 is deposited over the external surface of the formed circuit groove 3 and the resin film 12 (catalyst-depositing step) by such a catalyst-depositing treatment, a plating catalyst 5 is deposited on the entire surface, including the surfaces of the circuit grooves 3 and non-laser-processed resin film 12.

Figure 25E:
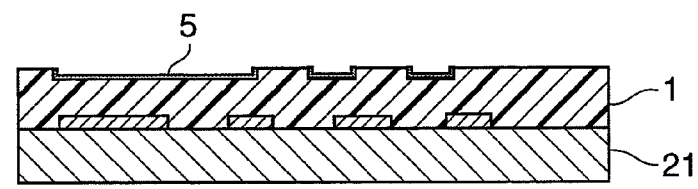

As shown in FIG. 25E, the resin film 12 is ten removed, as it is swollen or dissolved with a particular liquid (film-removing step). Processing in the step leaves the plating catalyst 5 remaining on the surface of the circuit grooves 3 formed by laser processing and removes the plating catalyst 5 deposited on the surface of the other resin film 12.

Figure 25F:
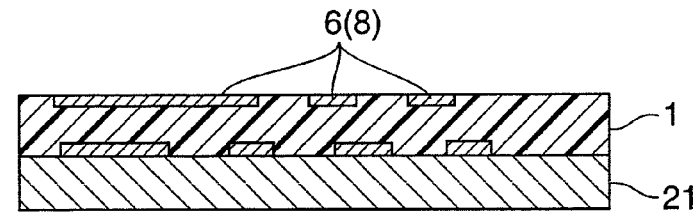

As shown in FIG. 25F, an electrolessly plated film 6 is formed in the region where the plating catalyst 5 remains unremoved (plating processing step). The step makes an electrolessly plated film 6 deposited on the regions where the second electrical circuit 8 is desirably formed.

Figure 26A:
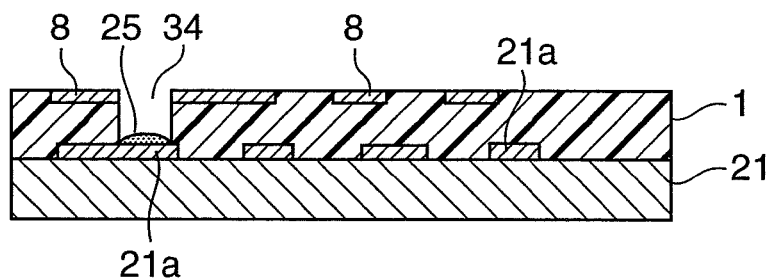
FIGS. 26A to 26C are stepwise crosssectional views explaining the last half steps in the method of producing a multilayer wiring substrate in the seventh embodiment of the present invention.
Figure 26B:
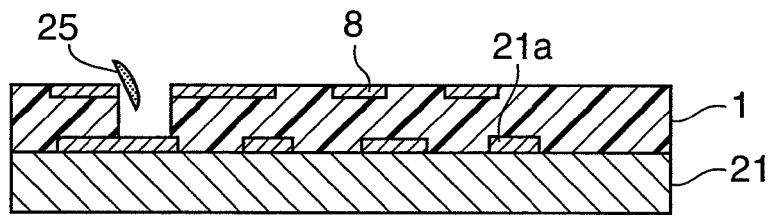

Then as shown in FIG. 26A, the surface of the first electrical circuit 21a is exposed by laser processing from above the region where the interlayer connection to the second electrical circuit 8 is desirably formed. A smear 25 remains then on the surface of the first electrical circuit 21a exposed by laser processing. The smear 25 is removed by desmear treatment, as shown in FIG. 26B.

Figure 26C:
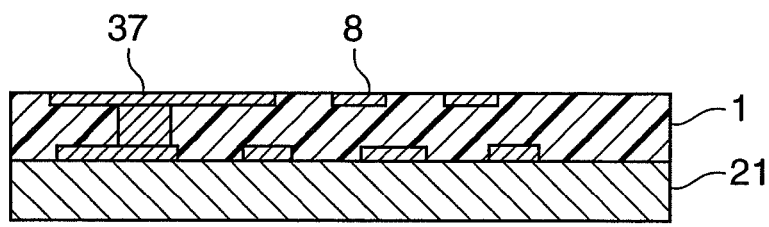

A plated film is grown by electrolytic or electroless plating on the surface of the first electrical circuit 21a exposed after desmear treatment, forming a conductive rod 37, as shown in FIG. 26C. The first electrical circuit 21a functions as electrode if electrolytic plating is carried out, while the first electrical circuit 21a functions as the surface plating nucleus if electroless plating is carried out.

It is possible by such a method to form conductive rods 37 for interlayer connection after separation of the resin film 12 and formation of the second electrical circuit 8. As a result, a second electrical circuit resistant to short circuiting and migration even when that having small wire width and wire interval is laminated by the build-up method.

EIGHTH EMBODIMENT

Preparation of by Using Swellable Resin Film Three-Dimensional Circuit Board

The method of producing a circuit board in the present embodiment will be described with reference to drawings.

FIGS. 27A to 27E are schematic crosssectional views respectively explaining the steps in the method of producing a three-dimensional circuit substrate in the eighth embodiment.

Figure 27A:
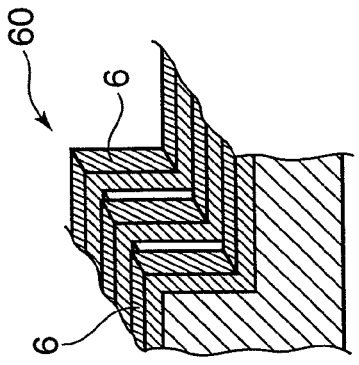
FIGS. 27A to 27E are local crosssectional views explaining the steps in the method of producing a wiring substrate in the eighth embodiment.

In the production method of the present embodiment, as shown in FIG. 27A, a resin film 12 is formed on the surface of an three-dimensional insulative substrate 51 having step-shaped regions.

Various traditional resin moldings used in production of three-dimensional circuit boards can be used without any restriction for the three-dimensional insulative substrate 51. Such a molding is preferably prepared by injection molding from the point of productivity. Typical examples of the resin materials for resin molding include polycarbonate resins, polyamide resins, various polyester resins, polyimide resins, polyphenylene sulfide resins and the like.

The method of producing the resin film 12 is not particularly limited. Specifically, it may be prepared for example by coating and drying a liquid material on the step face of a three-dimensional insulative substrate 51 where a resin film 12 is desirably formed. The coating method is not particularly limited. Specifically, a known method such as spin coating, bar coating, or spray coating can be used without particular restriction.

Figure 27E:
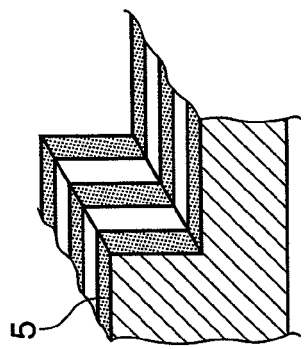
Figure 27C:
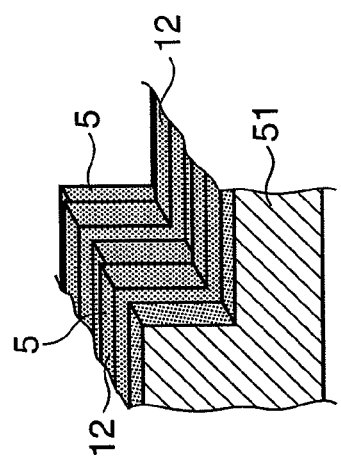
Figure 27D:
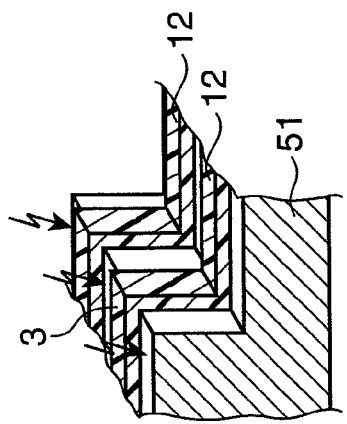
Figure 27B:
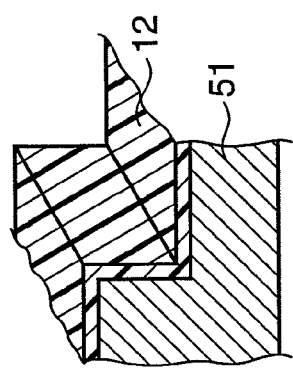

As shown in FIG. 27B, a circuit groove 3 in a particular pattern is then formed by removing the resin film only in particular regions from the external surface of the resin film 12 formed. The method of forming the circuit grooves is not particularly limited. Specifically, it is formed, for example, by laser processing, machining such as dicing, embossing, or the like. Laser processing is favorable for production of high-accuracy fine circuits. It is possible to adjust the machining depth and others arbitrarily by modifying the laser power by laser processing. For example, embossing processing by using a fine resin mold, such as that used in the field of nanoimprint, is carried out favorably.

The circuit grooves 3 formed in a particular circuit pattern defines the region of electrical circuit formed after electrolessly plated film is provided.

Then as shown in FIG. 27C, a plating catalyst 5 is deposited both on the surface carrying the circuit groove 3 formed and the surface carrying no circuit groove formed (catalyst-depositing step). As shown in FIG. 27, it is possible to deposit a plating catalyst 5 on the surface of the circuit groove 3 and on the surface of the resin film 2 by the catalyst-depositing treatment.

As shown in FIG. 27D, the resin film 12 is then removed from the surface of the three-dimensional insulative substrate 51, as it is swollen with a particular liquid (film-separating step). The step leave the plating catalyst 5 only in the regions of the step face of the three-dimensional insulative substrate 51 where the circuit is desirably formed.

As shown in FIG. 27E, an electrolessly plated film 6 is then formed only in the regions where the plating catalyst 5 remains unremoved (plating processing step). The step leads to deposition of an electrolessly plated film only in the region where the circuit groove 3 is formed.

The plating processing step leads to deposition of the electrolessly plated film only in the regions on the surface of the three-dimensional insulative substrate 51 where the plating catalyst 5 remains unremoved, thus, forming a conductive film accurately in the regions where the circuit is desirably formed. It is also possible to prevent deposition of the electrolessly plated film in the regions where circuit formation is undesirable. As a result, there is no unneeded plating film remaining between neighboring circuits, even when multiple fine circuits having narrow pitch interval and line width are formed. It is thus possible to prevent short circuiting and migration.

The three-dimensional circuit board 60 shown in FIG. 27E is formed in these steps. As described above, it is possible by the method of forming a circuit in the present embodiment to form a circuit accurately and easily, for example, on the step-shaped regions of three-dimensional circuit board.

The method of producing a circuit board described above in an aspect of the present invention includes a film-forming step of forming a swellable resin film on the surface of an insulative substrate, a circuit groove-forming step of forming circuit grooves having a depth equal to or greater than the thickness of the swellable resin film on the external surface of the swellable resin film, a catalyst-depositing step of depositing a plating catalyst or the precursor thereof both on the surface of the circuit grooves of the insulative substrate and the swellable resin film where there is no circuit groove formed, a film-separating step of making the swellable resin film swollen with a particular liquid and removing the swollen resin film from the insulative substrate surface, and a plating processing step of forming an electrolessly plated film only in the region where the plating catalyst or the plating catalyst formed from the plating catalyst precursor remains unremoved after removal of the swellable resin film. It is possible by such a production method to remove the undesired plating catalyst easily by separating the protective film after swelling. It is thus possible to form an electroless plated film only in the region defined by the residual plating catalyst. It is thus possible to keep the resulting circuit profile highly accurate. As a result, for example even when multiple circuit wires are drawn at a particular interval, there is no fragment for example of the electrolessly plated film between the circuit wires, eliminating concern about short circuiting and migration. It is also possible to form a circuit having a desired depth.

The swelling degree of the swellable resin film when processed with the liquid is preferably 50% or more. By using a swellable resin film having such a swelling degree it is possible to remove the swellable resin film easily from the insulative substrate surface.

The swellable resin film is preferably a film prepared by coating and drying an elastomer suspension or emulsion on the surface of the insulative substrate surface. It is possible to form a swellable resin film easily on the surface of the insulative substrate by such a method.

Alternatively, the swellable resin film is preferably formed by transferring a resin film previously prepared by coating and drying an elastomer suspension or emulsion on a support substrate onto the surface of the insulative substrate. Such a method is preferable, as it is advantageous in mass productivity, because it is possible to prepare multiple swellable resin films in advance.

The elastomer above is preferably an elastomer selected from the group consisting of diene-based elastomers, acrylic elastomers and polyester elastomers, and particularly preferably, a styrene-butadiene-based copolymer. It is possible with such an elastomer to form a swelling film having a desired swelling degree, by adjusting the crosslinking degree or the gelation degree thereof.

Such an elastomer is also preferable, because, if the liquid is an aqueous alkaline solution, it is possible to separate the swellable resin film easily from the substrate by swelling.

The thickness of the swellable resin film is preferably 10 µm or less, for preparation of the fine circuit at high accuracy.

The width of the region to be partially removed by circuit pattern formation above is preferably 20 µm or less, for production of products demanding fine processing such as antenna circuits.

It is also advantageous, because, if circuit grooves are formed by laser processing in the circuit groove-forming step, it is possible to form a fine circuit at high accuracy and control for example the machining depth easily by adjusting the laser power. It is also possible by using laser processing, to form through-holes for interlayer connection and install capacitors in the insulative substrate.

The method of producing a circuit board in another aspect of the present invention includes a film-forming step of forming a resin film on the surface of the insulative substrate, a circuit groove-forming step of forming circuit grooves having a depth equal to or greater than the thickness of the resin film on the external surface of the resin film, a catalyst-depositing step of depositing a plating catalyst or the precursor thereof on the surface of the circuit grooves and the surface of the resin film, a film-removing step of removing the resin film, and a plating processing step of electroless-plating the insulative substrate after removal of the resin film, wherein, in the circuit groove-forming step, a local reinforcement structure is formed in a region of the circuit groove. It is possible by such a production method to form a circuit patterned region having a desired depth and shape, for example by laser processing, on the external surface of the resin film formed on the insulative substrate. Deposition of a plating catalyst over the entire surface of the insulative substrate carrying the circuit-patterned resin film and subsequent separation of the resin film leaves the plating catalyst only on the surface of the circuit patterned region. Electroless plating on the insulative substrate leaves a plated film formed only on the surface of the circuit patterned region. In this case, it is possible to improve the mechanical strength and the adhesion strength of the region of electrical circuit that is easily damaged, by forming a three-dimensional reinforcing structure, specifically by forming an irregular shape having anchoring action on the surface of the circuit patterned region or a partially thick plated film by engraving the groove deeper in the region desirably reinforced.

In the production method for an electrical circuit, the circuit patterned region preferably has at least one land region for surface mounting of electronic parts and circuit wiring regions formed integrally with the land regions, wherein the irregular shape is formed on the surface of the land regions. Land regions for mounting electronic parts such as LSIs are regions particularly fragile and easily separated by impact. Installation of an irregular shape on the surface of such an impact-vulnerable land region leads to improvement in adhesive strength of the metal wiring in the land region and thus in the mounting strength of the LSIs and others mounted thereon.

Preferably in the method of producing an electrical circuit described above, the circuit patterned region has at least one land region for surface mounting of electronic parts and circuit wiring regions formed integrally with the land regions, and the partial reinforcing structure is formed in such a manner that the land region has a groove depth equal to or greater than that in the circuit wiring region. When the electrical circuit board is exposed to impact in the state carrying electronic parts mounted thereon, in the circuit pattern having land regions and the circuit wiring regions integrally formed with the land regions, the regions close to the connection area between the land regions and the circuit wiring regions are often cleaved. In such a case, it is possible to make the plated film formed in the land region thicker than the plated film formed in the circuit wiring region, by forming a partial reinforcing structure by making the groove depth in the land region greater than the groove depth of the circuit wiring region. It is possible in this way to reinforce the connection area between the land region and the circuit wiring region.

Also preferably in the method of producing an electrical circuit, the circuit patterned region has at least one land region for surface mounting of electronic parts and circuit wiring regions formed integrally with the land regions, and the partial reinforcing structure is a protrusion formed on the periphery of the grooves in the land region. The protrusions formed on the periphery of the grooves in the land region further improve the mounting strength when LSIs and others are mounted.

The method of producing a multilayer circuit board in yet another aspect of the present invention includes a film-forming step of forming a resin film on the surface of an insulation layer formed on a circuit board that embeds conductive rods extruding at predetermined positions of a first electrical circuit, a circuit groove-forming step of forming circuit grooves having a depth equal to or greater than the thickness of the resin film by laser processing on the external surface of the resin film, a conductive rod-exposing step of exposing the conductive rods by laser processing from the external surface of the resin film, a catalyst-depositing step of depositing a plating catalyst or the precursor thereof on the surface of the exposed conductive rods, circuit grooves in the insulation layer, the internal wall of the pores formed in the insulation layer by exposure of the conductive rod, and the surface of the resin film, a film-removing step of removing the resin film, and a plating processing step of forming a second electrical circuit by forming an electrolessly plated film in the region where the plating catalyst remains unremoved after the film-removing step and connecting the first and the second electrical circuits to each other with the conductive rods by interlayer connection. It is possible in the configuration to deposit a plating catalyst only on the surface of circuit grooves by forming circuit grooves by removing the resin film formed on the insulation layer surface of the conductive rod-containing circuit board partially by laser processing, depositing a plating catalyst on the surface of the circuit grooves and the entire surface of the unremoved resin film, and then, removing the resin film. Thus, an electrolessly plated film is formed only in the region defined by the region carrying the deposited plating catalyst. It is possible in this way to form an electrical circuit having a high-definition profile by depositing a plating catalyst only in the region where the electrical circuit is desirably formed. In addition, because the electrolessly plated film is formed after exposure of the conductive rod by laser processing from the external surface of the resin film, the first electrical circuit previously formed and the second electrical circuit newly formed on the insulation layer may be interlayer-connoted to each other with the conductive rods. In this case, the lower-layer first electrical circuit, which has a conductive rods formed therein, remains undamaged, even if the conductive rods are exposed, as they are dug deeper. Thus, the smear on the conductive rod surface can be removed completely by high-energy laser processing. For that reason, the first and second electrical circuits can be connected to each other sufficiently via the conductive rod by interlayer connection without desmear treatment. Because the interlayer connection is possible without need for desmear treatment by the present method, it is possible to prevent separation or solubilization by desmear treatment of the resin film for use in preparation of the second electrical circuit.

Preferably, the circuit board carrying the embedded conductive rod preferably has a conductive film for heat radiation containing conductive rods formed as electrically insulated from the first electrical circuit additionally on the surface having the first electrical circuit formed; the conductive rods in the conductive film for heat radiation are preferably embedded in the insulation layer together with the conductive rods protruding in the first electrical circuit; the conductive rod-exposing step has an additional step of exposing the conductive rods formed protruding in the conductive film for heat radiation by laser processing from the external surface of the resin film; in the catalyst-depositing step, a plating catalyst or the precursor thereof is deposited additionally on the surface of the conductive rods exposed in the conductive film for heat radiation and the internal wall of the hole formed in the insulative layer by exposure of the conductive rod; and the secondary radiator connected to the first radiator by interlayer connection is formed in the plating processing step. The circuit board thus formed is superior in heat radiation efficiency.

For exposure of the conductive rods, part of the top region of the conductive rod may be removed by laser processing. The conductive rod has a height sufficiently large, compared with the thickness of the metal foil for the first electrical circuit. Therefore, even if high-strength laser is irradiated on the conductive rod, the metal foil for the first electrical circuit remains undamaged. It is thus possible without desmear treatment to remove the smear remaining on the conductive rod surface sufficiently by laser processing to a degree that the top region of the conductive rod is removed locally.

The method of producing a multilayer circuit board described above preferably includes an additional inspection step of examining film-removing failure by adding a fluorescent substance to the resin film and monitoring emission from the fluorescent substance after the film-removing step. In the above-mentioned method of producing a multilayer circuit board, there is a concern that the film in the region between neighboring wirings where the film should be removed may remain in a small amount without complete removal when the wire width and the wire interval are extremely small. There is also a concern that the fragments of the resin film removed by laser processing migrate into and remain in the circuit grooves formed. If the resin film remains between wiring, the plated film is formed in the region inevitably, possibly causing migration and short circuiting. In addition, the fragments of the resin film, if they remain in the circuit groove formed, may cause heat resistance defects and propagation loss of the electrical circuit obtained. In such a case, as described above, it is possible to examine the presence of film-removing failures and the positions of the film-removing failures, by adding a fluorescent substance to the resin film, irradiating the light from a particular light source onto the film-removed face, and thus allowing emission of the fluorescent substance in the region where the film remains after the film-removing step.

The resin film is preferably a swellable resin film that can be separated from the insulation layer surface as it is swollen with a particular liquid, and specifically, it is preferably a swellable resin film having a swelling degree of 50% or more to the liquid. It is possible by using such a swellable resin film to separate the resin film easily from the insulation layer surface.

The conductive rod-containing circuit board is preferably is a substrate having an insulation layer laminated integrally on the surface carrying conductive rods previously formed therein protruding at predetermined positions in the first electrical circuit, because it is easier to embed the conductive rod in the insulation layer and thus to produce the circuit board.

The conductive rod-containing circuit board is preferably a substrate obtained by coating a resin solution on the surface having conductive rods previously formed as they protrude at predetermined positions in the first electrical circuit and hardening it into an insulation layer, because it is possible to adjust the thickness of the insulation layer easily.

The conductive rod-containing circuit board is preferably a substrate obtained by first forming an insulation layer on the surface of an electrical circuit, exposing the electrical circuit by drilling from the surface opposite to the surface carrying the first electrical circuit of the insulation layer, and forming conductive rods in the drilled regions by growing a plated film from the exposed first electrical circuit surface. In this case, the step of growing a plated film in the drilled region is more preferably a step of growing a plated film by electrolytic plating by using the first electrical circuit exposed after desmear treatment after drilling as electrode. It is possible by the method, to desmear the surface of the first electrical circuit before preparation of the resin film and then, form conductive rods for interlayer connection by electrolytic plating. Thus, there is no concern about the resin film being swollen or dissolved by desmear treatment in preparation of the circuit. It is possible in this case to form conductive rods easily, because the plated film is grown by electrolytic plating of using the exposed first electrical circuit as electrode. If power application to the first electrical circuit is difficult, the plated film may be grown by electroless plating by using the exposed electrical circuit surface as plating nucleus.

Yet another method of producing a multilayer circuit board according to the present invention includes an insulation layer-forming step of forming an insulation layer on the surface of a substrate carrying a first electrical circuit formed thereon, a film-forming step of forming a resin film on the insulation layer surface, a circuit groove-forming step of forming circuit grooves having a depth equal to or greater than the thickness of the resin film by laser processing on the external surface of the resin film, a catalyst-depositing step of depositing a plating catalyst or the precursor thereof both on the surface of the circuit grooves and the surface of the resin film, a film-removing step of removing the resin film, a plating processing step of forming a second electrical circuit by forming an electrolessly plated film in the region where the plating catalyst remains unremoved after the film-removing step, a laser processing step of exposing the first electrical circuit in a particular region of the second electrical circuit by laser processing, and an interlayer connection-forming step of connecting the first and second electrical circuits to each other by interlayer connection by growing a plated film on the surface of the exposed first electrical circuit and thus, forming conductive rods on the surface of the first electrical circuit. In the configuration above, an interlayer connection region with the first electrical circuit can be formed at a desired region after preparation of the second electrical circuit. Because conductive rods for interlayer connection between the first and second electrical circuits are formed by drilling the second electrical circuit after preparation and growing a plated film thereon, production of the second electrical circuit is not affected even when the first electrical circuit surface is desmear-treated for removal of smear. As a result, even when a second electrical circuit having small wire width and wire interval is laminated by the build-up method, a second electrical circuit resistant to short circuiting and migration is formed. It is possible in this case to form the conductive rods easily, because it is possible to grow the plated film by electrolytic plating by using the exposed first electrical circuit as electrode. If power application to the first electrical circuit is difficult, the plated film may be grown by electroless plating by using the exposed electrical circuit surface as plating nucleus.

Preferably, the substrate has a first conductive film for heat radiation formed as electrically insulated from the first electrical circuit additionally on the surface having the first electrical circuit formed; and the circuit groove-forming step has an additional step of forming a second conductive film forming groove for heat radiation isolated from the circuit groove equal to or greater than the thickness of the resin film by laser processing from above the first conductive film; and in the catalyst-depositing step, depositing a plating catalyst or the precursor thereof additionally on the surface of the second conductive film forming groove; and in a plating processing step, forming a second conductive film for heat radiation by forming an electrolessly plated film on the surface of the second conductive film forming groove; and the laser processing step exposing the first electrical circuit has an additional step of exposing the first conductive film for heat radiation by laser processing from above the first conductive film; and in the interlayer connection-forming step, connecting the first and the second conductive films to each other by interlayer connection by growing a plated film on the surface of the exposed first conductive film, additionally.

According to this configuration, in the image forming apparatus, the determination that the document image is color or monochromatic is performed, and the image data for use in the image forming can be compressed in a compression format which is suitable for the document image. Accordingly, it becomes easy to reduce the capacity of the storage section. This application is based on Japanese Patent application serial Nos. 2008-118818, 2008-193931, 2008-217091 and 2008-246431 filed in Japan Patent Office on Apr. 30, 2008, Jul. 28, 2008, Aug. 26, 2008 and Sep. 25, 2008, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method of producing a circuit board, comprising:
   a film-forming step of forming a swellable resin film on the surface of an insulative substrate;
   a circuit groove-forming step of forming circuit grooves having a depth equal to or greater than the thickness of the swellable resin film on the external surface of the swellable resin film;
   a catalyst-depositing step of depositing a plating catalyst or the precursor thereof on the surface of the circuit grooves and the surface of the swellable resin film;
   a film-separating step of swelling the swellable resin film with a particular liquid and then separating the swollen resin film from the insulative substrate surface; and
   a plating processing step of forming an electrolessly plated film only in the region where the plating catalyst or the plating catalyst formed from the plating catalyst precursor remains unseparated after separation of the swellable resin film.

2. The method of producing a circuit board according to claim 1, wherein the swelling degree of the swellable resin film to the liquid is 50% or more.

3. The method of producing a circuit board according to claim 1, wherein the swellable resin film is a film formed by coating and drying an elastomer suspension or emulsion on the surface of the insulative substrate.

4. The method of producing a circuit board according to claim 3, wherein the elastomer is selected from the group consisting of diene-based elastomers, acrylic elastomers, and polyester elastomers.

5. The method of producing a circuit board according to claim 3, wherein the elastomer is a styrene-butadiene-based copolymer.

6. The method of producing a circuit board according to claim 5, wherein the liquid is an aqueous alkaline solution.

7. The method of producing a circuit board according to claim 1, wherein the swellable resin film is formed by transferring a resin film formed on a support substrate.

8. The method of producing a circuit board according to claim 1, wherein the thickness of the swellable resin film is 10 µm or less.

9. The method of producing a circuit board according to claim 1, wherein the forming circuit groove in the circuit groove-forming step have a region having width of 20 µm or less.

10. The method of producing a circuit board according to claim 1, wherein the circuit grooves are formed by laser processing in the circuit groove-forming step.

11. The method of producing a circuit board according to claim 1, wherein the circuit grooves are formed by embossing in the circuit groove-forming step.

12. The method of producing a circuit board according to claim 1, wherein through-holes are formed in the insulative substrate in the circuit groove-forming step.

13. The method of producing a circuit board according to claim 1, wherein two capacitor-forming electrode grooves facing each other via the insulative substrate-constituting material as dielectric are formed in the insulative substrate for preparation of a capacitor structure in the circuit board in the circuit groove-forming step.

14. The method of producing a circuit board according to claim 1, wherein the insulative substrate has a step-shaped face and the insulative substrate surface is the step-shaped face.

15. A circuit board, obtained by the production method according to claim 1.

16. The method of producing a circuit board according to claim 1, wherein the swellable resin film contains a fluorescent substance, and the method contains an additional inspection step of examining film-separating failure by monitoring emission from the fluorescent substance after the film-separating step.

* * * * *